US010581200B2

(12) United States Patent
Zhong et al.

(10) Patent No.: US 10,581,200 B2
(45) Date of Patent: Mar. 3, 2020

(54) ELECTRICAL CONNECTOR WITH RETENTION STRUCTURE HOLDING LEVER

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Wei-Jian Zhong, Shenzhen (CN); Fu-Jin Peng, Shenzhen (CN); Qi-Jin Yi, Shenzhen (CN)

(73) Assignees: FU DING PRECISION COMPONENT (SHEN ZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/120,442

(22) Filed: Sep. 3, 2018

(65) Prior Publication Data

US 2019/0074634 A1     Mar. 7, 2019

(30) Foreign Application Priority Data

Sep. 1, 2017    (CN) ...................... 2017 2 1120221 U
Dec. 29, 2017   (CN) ...................... 2017 2 1918758 U
Dec. 29, 2017   (CN) ...................... 2017 2 1920219 U

(51) Int. Cl.
*H01R 12/88*    (2011.01)
*H01R 13/639*   (2006.01)
(Continued)

(52) U.S. Cl.
CPC ........... *H01R 13/639* (2013.01); *H01L 23/32* (2013.01); *H01R 12/712* (2013.01); *H01R 12/88* (2013.01);
(Continued)

(58) Field of Classification Search
CPC .... H01R 13/639; H01R 12/88; H01R 12/712; H01R 13/5025; H05K 7/1053; H01L 23/32
See application file for complete search history.

(56) References Cited

U.S. PATENT DOCUMENTS 6,406,317 B1 *   6/2002   Li .......................... H01R 12/89
                                                      439/259
6,991,474 B1 *   1/2006   Ju ......................... H05K 7/1061
                                                      439/331
(Continued)

FOREIGN PATENT DOCUMENTS

CN          2540046 Y      3/2003
CN        202997183 U      6/2013
CN        104218345 A     12/2014

*Primary Examiner* — Truc T Nguyen
(74) *Attorney, Agent, or Firm* — Wei Te Chung; Ming Chieh Chang

(57) ABSTRACT

An electrical connector includes an insulative base, an insulative cover attached upon the base and moveable along a front-to-back direction, and an operation lever sandwiched between the base and the cover for moving the cover relative to the base in the front-to-back direction. The lever includes an actuating bar sandwiched between the upper head and the lower head, and an operation bar exposed outside of the base and the cover. The operation bar is rotatable between a horizontal position and a vertical position. The lower head includes a stopper around a front end of the operation bar with a locking section engaged with the operation bar wherein said locking section extends toward the operation bar either inwardly along the transverse direction or in the front-to-back direction.

20 Claims, 28 Drawing Sheets

(51) Int. Cl.
*H01R 13/502* (2006.01)
*H01L 23/32* (2006.01)
*H01R 12/71* (2011.01)
*H05K 7/10* (2006.01)

(52) U.S. Cl.
CPC ....... *H01R 13/5025* (2013.01); *H05K 7/1053* (2013.01)

(56) References Cited

U.S. PATENT DOCUMENTS

| | | | | |
|---|---|---|---|---|
| 7,275,950 | B1* | 10/2007 | Ma | H05K 7/1053 439/342 |
| 9,960,513 | B1* | 5/2018 | Peng | H01R 12/88 |
| 2005/0191890 | A1* | 9/2005 | Taylor | H01R 13/2442 439/342 |
| 2008/0242122 | A1* | 10/2008 | Ma | H05K 7/1053 439/66 |
| 2011/0223790 | A1* | 9/2011 | Hoshino | H01R 13/641 439/329 |
| 2011/0269326 | A1* | 11/2011 | Hsu | H05K 7/1053 439/296 |
| 2012/0196469 | A1* | 8/2012 | Yeh | H01R 12/88 439/345 |
| 2016/0380368 | A1* | 12/2016 | Tojo | H01R 12/79 439/329 |
| 2017/0033476 | A1* | 2/2017 | Chen | G06K 7/00 |

* cited by examiner

ELECTRICAL CONNECTOR WITH RETENTION STRUCTURE HOLDING LEVER

BACKGROUND OF THE DISCLOSURE

1. Field of the Disclosure

The present disclosure relates to an electrical connector, and more particularly to an electrical connector having the retention structure holding the rotatable lever in an upstanding position for having the connector retained in an open position for loading an electronic package thereon.

2. Description of Related Arts

U.S. Pat. No. 6,383,006 discloses an electrical connector upon which an electronic package, i.e., the CPU (Central Processing Unit), is mounted, wherein the lateral side of the base forms a retention protrusion to retain the L-shaped lever in an upstanding position for being ready for mounting the CPU thereon. Anyhow, such a lateral protrusion may result in outward lateral deflection of the lever, thus tending to urge the lever to leave away from the base and jeopardize the true lateral position of the lever relative to the base after repeatedly use.

An improved electrical connector is desired.

SUMMARY OF THE DISCLOSURE

Accordingly, an object of the present disclosure is to provide an electrical connector with reliable retention mechanism to retain the L-shaped lever in an upstanding position during loading the CPU thereon without potential risk of damaging the existing retention structure between the base and the lever.

To achieve the above object, an electrical connector for connecting a CPU to a printed circuit board, includes an insulative base, an insulative cover attached upon the base and moveable along a front-to-back direction, and an operation lever sandwiched between the base and the cover for moving the cover relative to the base in the front-to-back direction. The base includes a main body and a lower head, and the cover includes a carrying portion located upon the main body, and an upper head located upon the lower head. The lever includes an actuating bar sandwiched between the upper head and the lower head, and an operation bar exposed outside of the base and the cover. The operation bar is rotatable between 0 degree where the operation bar is parallel to the main body, and 90 degrees where the operation bar is perpendicular to the main body, in a side view. The lower head includes a stopper around a front end of the operation bar with a protruding block or locking section engaged with the operation bar wherein said protruding block extends toward the operation bar either inwardly along the transverse direction or rearwardly in the front-to-back direction. Optionally and optimally, the protruding block may be equipped with a spring so as to form a soft transitional engagement with the operation bar for lasting the long life of the electrical connector after repeated use of the lever.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
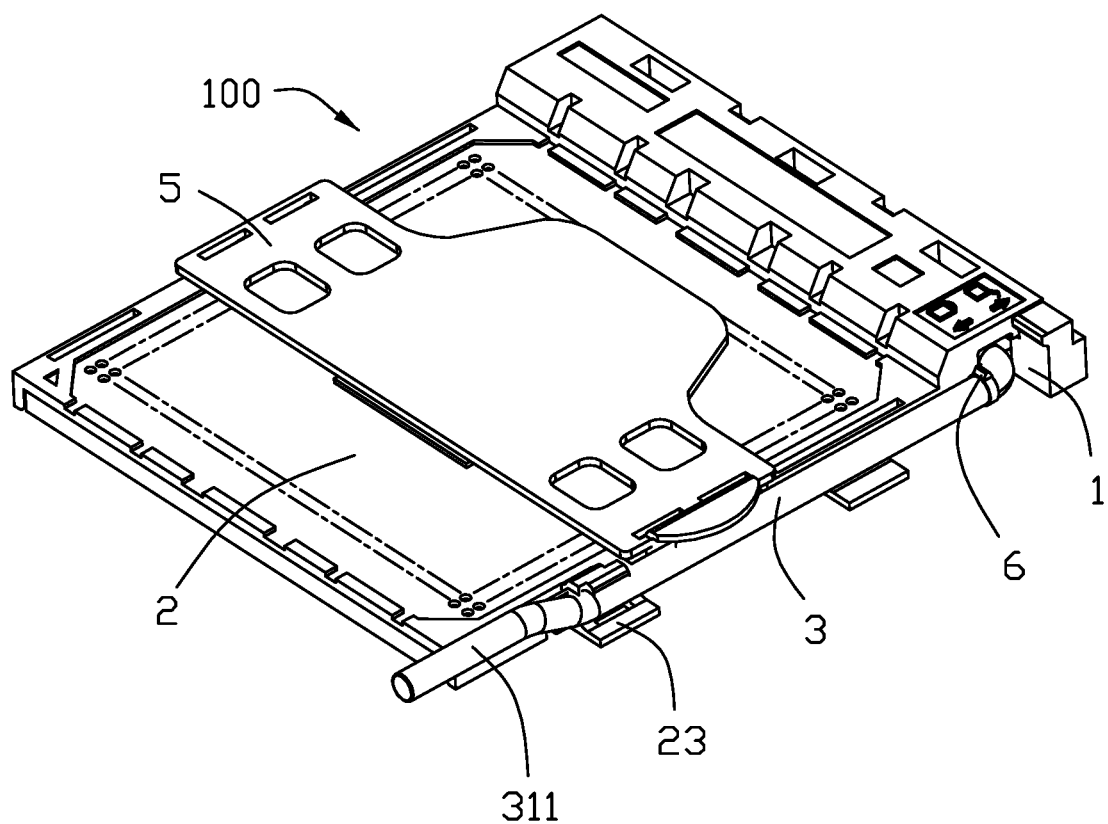
FIG. 1 is an assembled perspective view of an electrical connector wherein the lever is rotated to a horizontal position according to a first embodiment of the invention.
Figure 2:
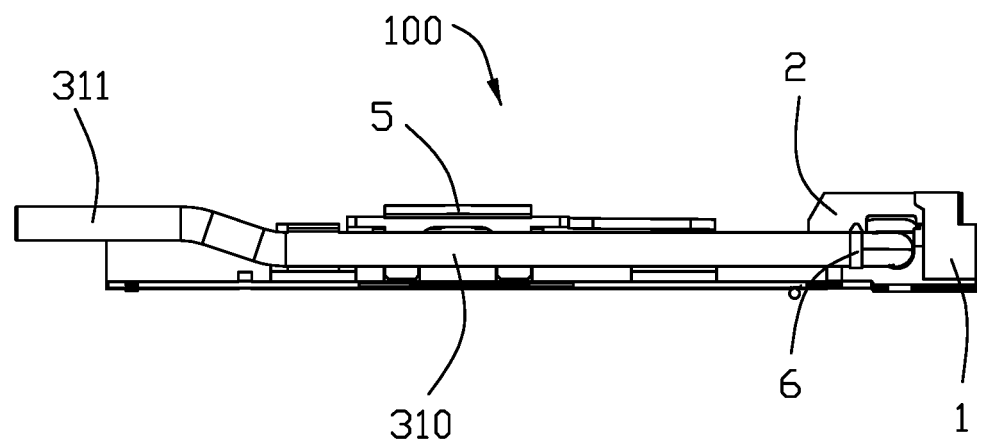
FIG. 2 is a side view of the electrical connector of FIG. 1.
Figure 3:
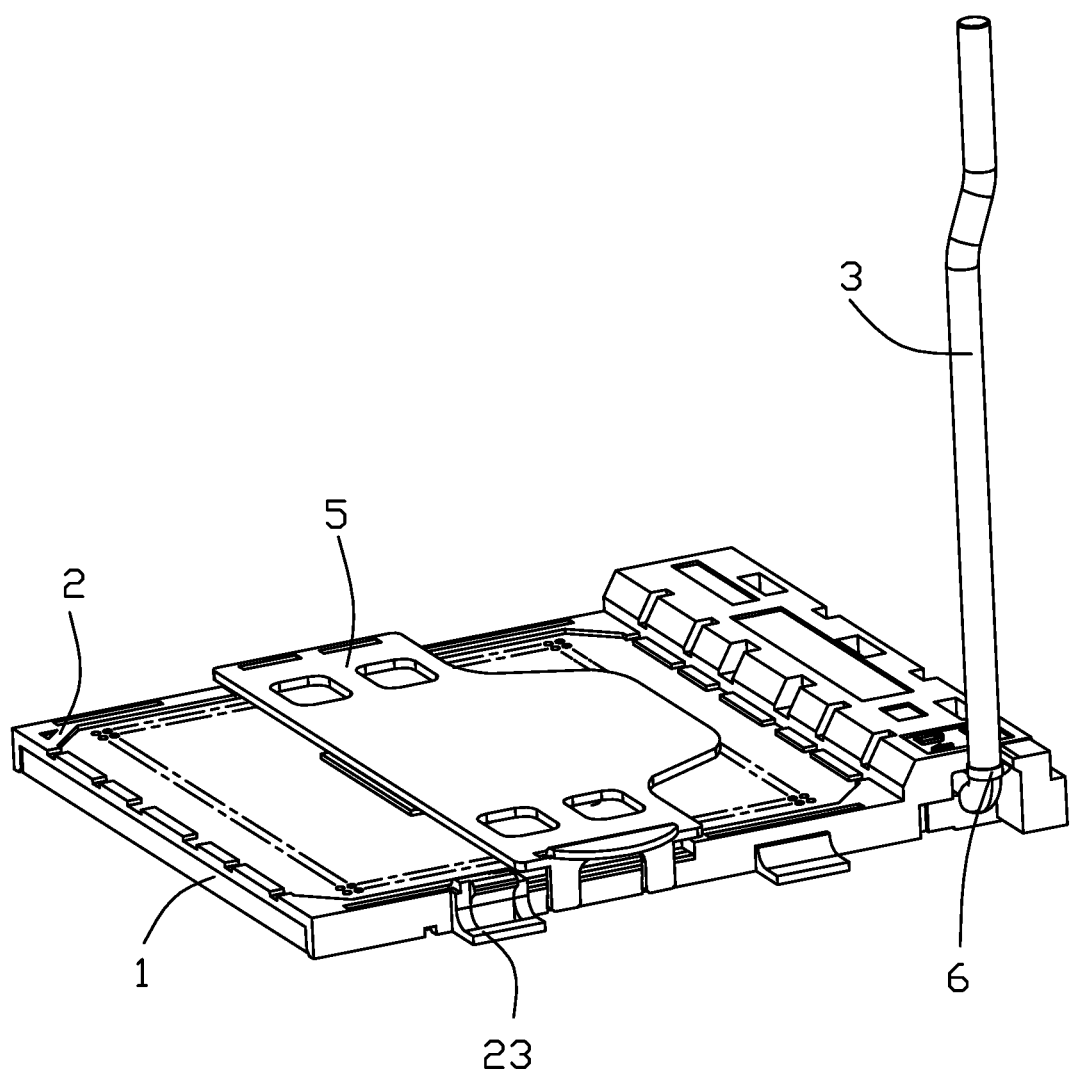
FIG. 3 is an assembled perspective view of the electrical connector of FIG. 1 wherein the lever is rotated to an upstanding position.
Figure 4:
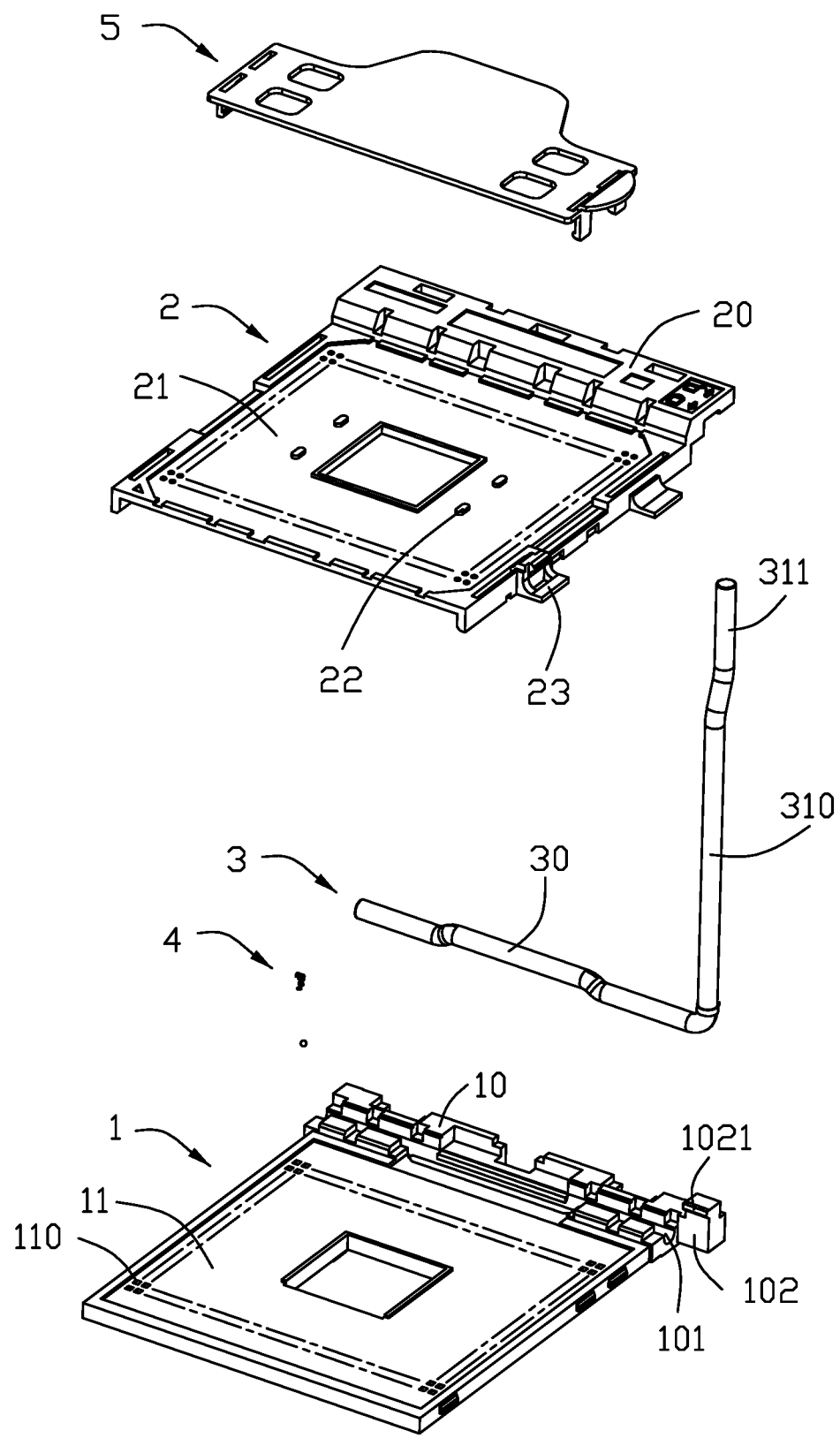
FIG. 4 is an exploded perspective view of the electrical connector of FIG. 3.
Figure 5:
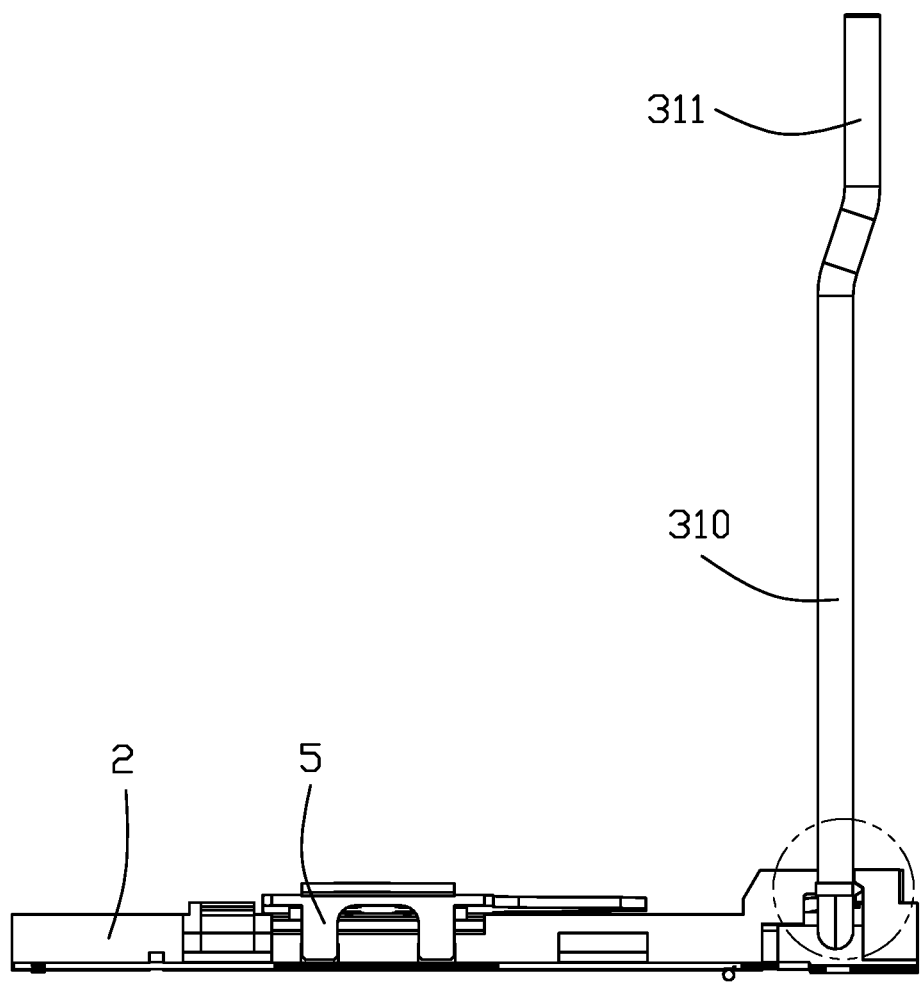
FIG. 5 is a side view of the electrical connector of FIG. 3.
Figure 6:
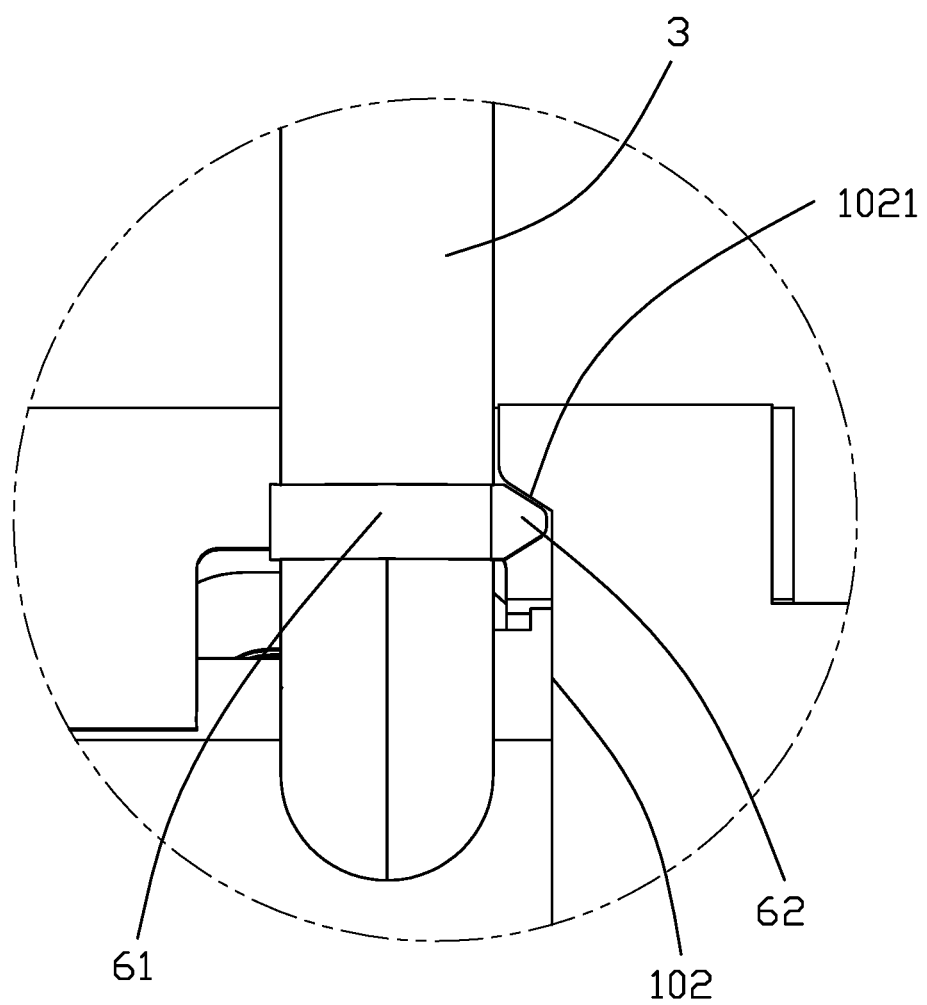
FIG. 6 is an enlarged side view of a portion of the electrical connector of FIG. 5.
Figure 7:
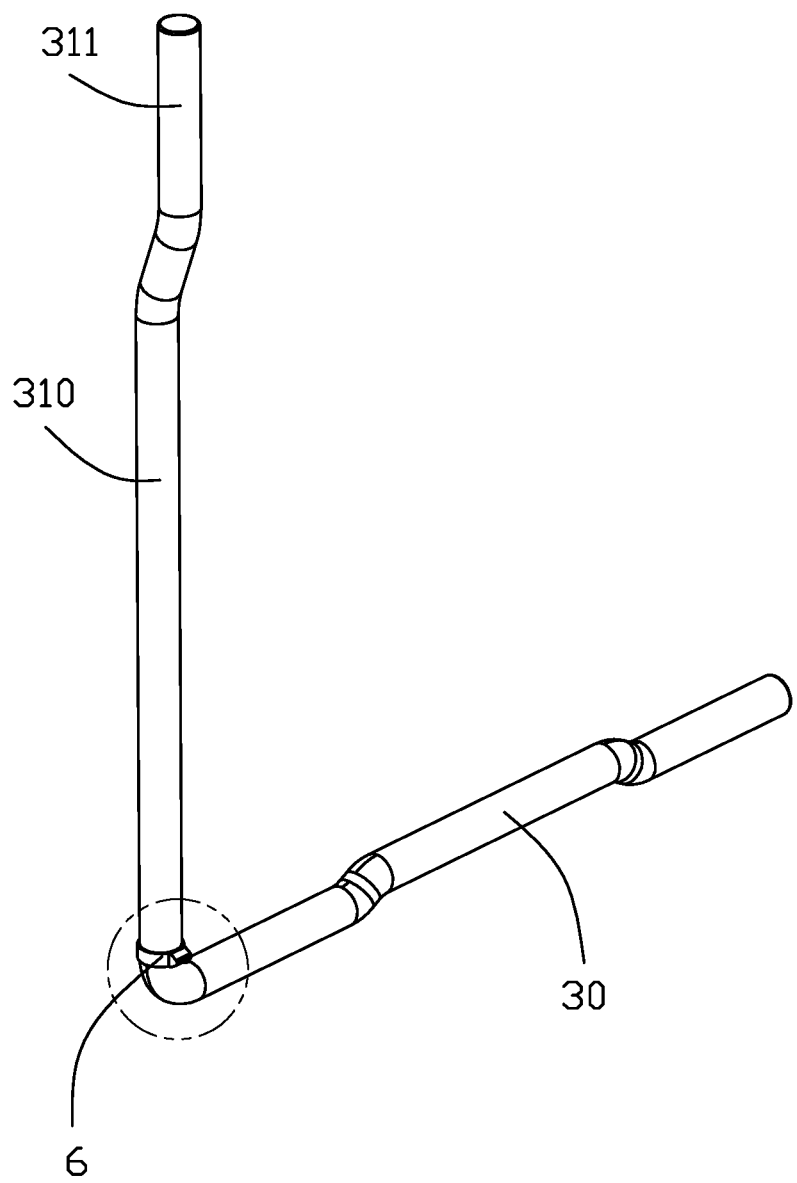
FIG. 7 is a perspective view to the lever of the electrical connector of FIG. 1.
Figure 8:
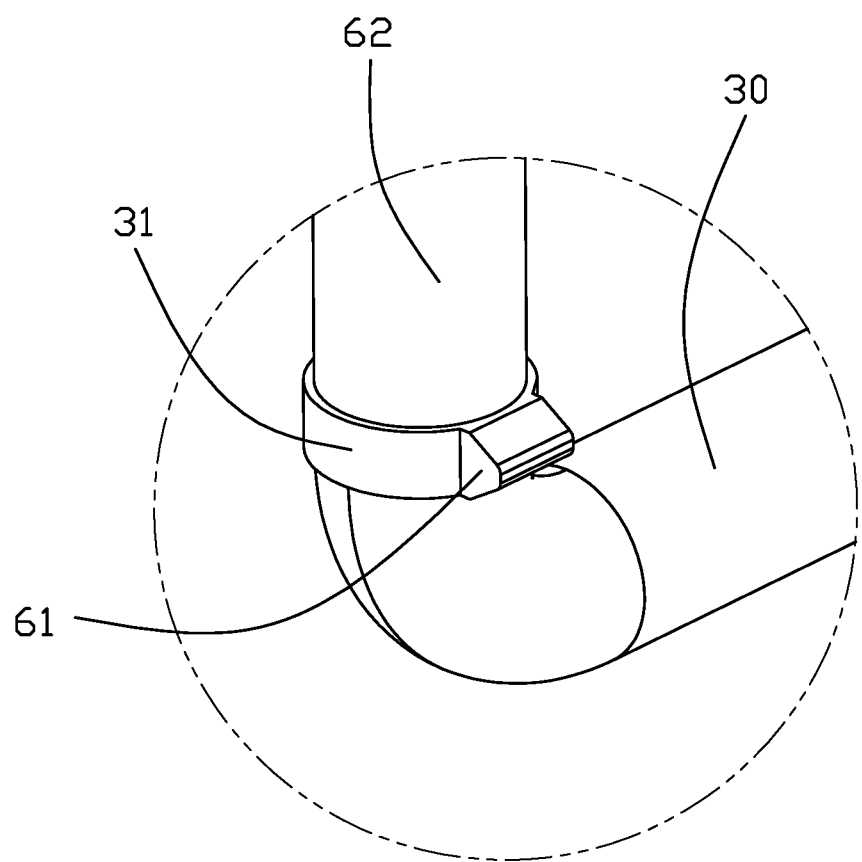
FIG. 8 is an enlarged perspective view of a portion of the lever of the electrical connector of FIG. 7.

Reference will now be made in detail to the embodiments of the present disclosure. The reference numerals are only referred to their own embodiments, respectively, not throughout all different embodiments. The first embodiment will be shown in FIGS. 1 to 8.

An electrical connector 100 for connecting a CPU (not shown), which is adapted to be loaded therein, to a printed circuit board (not shown) on which the connector 100 is seated, includes an insulative housing 1, an insulative cover 2 attached upon the housing 1 in a vertical direction, a plurality of contacts 4 disposed in the housing/base 1, a metallic or plastic lever 3 urging the cover 2 to move back and forth relative to the housing 1 in a front-to-back direction perpendicular to the vertical direction, and a pick-up cap 5 mounted upon the cover 2 for mounting the electrical connector 100 upon the printed circuit board via a suction device.

The housing 1 includes a main body 11 having corresponding passageways 110 to receive the corresponding contacts 4 therein respectively, and a lower head 10 located in front of the main body 11 and including a groove 101 extending therethrough in a transverse direction perpendicular to both the vertical direction and the front-to-back direction. A stopper 102 is formed on the lower head 10 and located in front of the lever 3.

The cover 2 includes a carrying portion 21 aligned with the main body in the vertical direction, and an upper head 20 aligned with the lower head 10 in the vertical direction. The carrying portion 21 forms a plurality of through holes 22, through which pins of the CPU downwardly extend, in alignment with the corresponding passageways 110 in the vertical direction.

The lever 3 of an L-shape includes an actuating bar 30 between the upper head 20 and the lower head 10 and essentially within the groove 101, and an operation bar 31 extending outside of the groove 101. The operation bar 31 includes a connection section 310 linked to the actuation bar 30, and an operation section 311 extending from the connection section 310 in an offset manner. Notably, the operation section 311 is higher than the connection section 310 when the operation bar 31 is located at the horizontal position, i.e., at the zero degree, and intimately positioned beside the housing 1 for easy operation. When the operation bar 31 is rotated to the vertical position, i.e., at the ninety degrees, the operation bar 31 is perpendicular to the main body 11. The cover 2 includes two ears 23 to support the operation bar 31.

The operation bar 31 is equipped with an interference part 6 which is adjacent to the actuation bar 30 and includes a fixing section 61 and an engagement section 62 extending toward the stopper 102. The stopper 102 forms a locking section 1021 for engagement with the engagement section 62 in the vertical direction when the operation bar 31 is rotated to the vertical position so as to temporarily retain the operation bar 31 in the vertical position. Notably, the interference part 6 could be applied upon the metallic lever 3 via an insert-molding process or directly formed thereon by forging.

After assembled, the contacts 4 are received within the passageways 110, and the actuation bar 30 is rotatably received within the groove 101 to urge the cover 2 to move relative to the housing 1. The lever 3 is rotatable within a range between zero degree to ninety degrees wherein the CPU can be loaded or unloaded on the cover 2 when the operation bar 31 of the lever 3 is moved to the vertical position, and can be engaged with the contacts 4 when the lever is moved to the horizontal position. In this embodiment, the disengagement between the interference part 6 and the stopper 102 essentially imposes force along the front-to-back direction instead of the outward/lateral direction, thus avoiding potential jeopardized retention of the actuation bar 30 within the groove 101.

Figure 9:
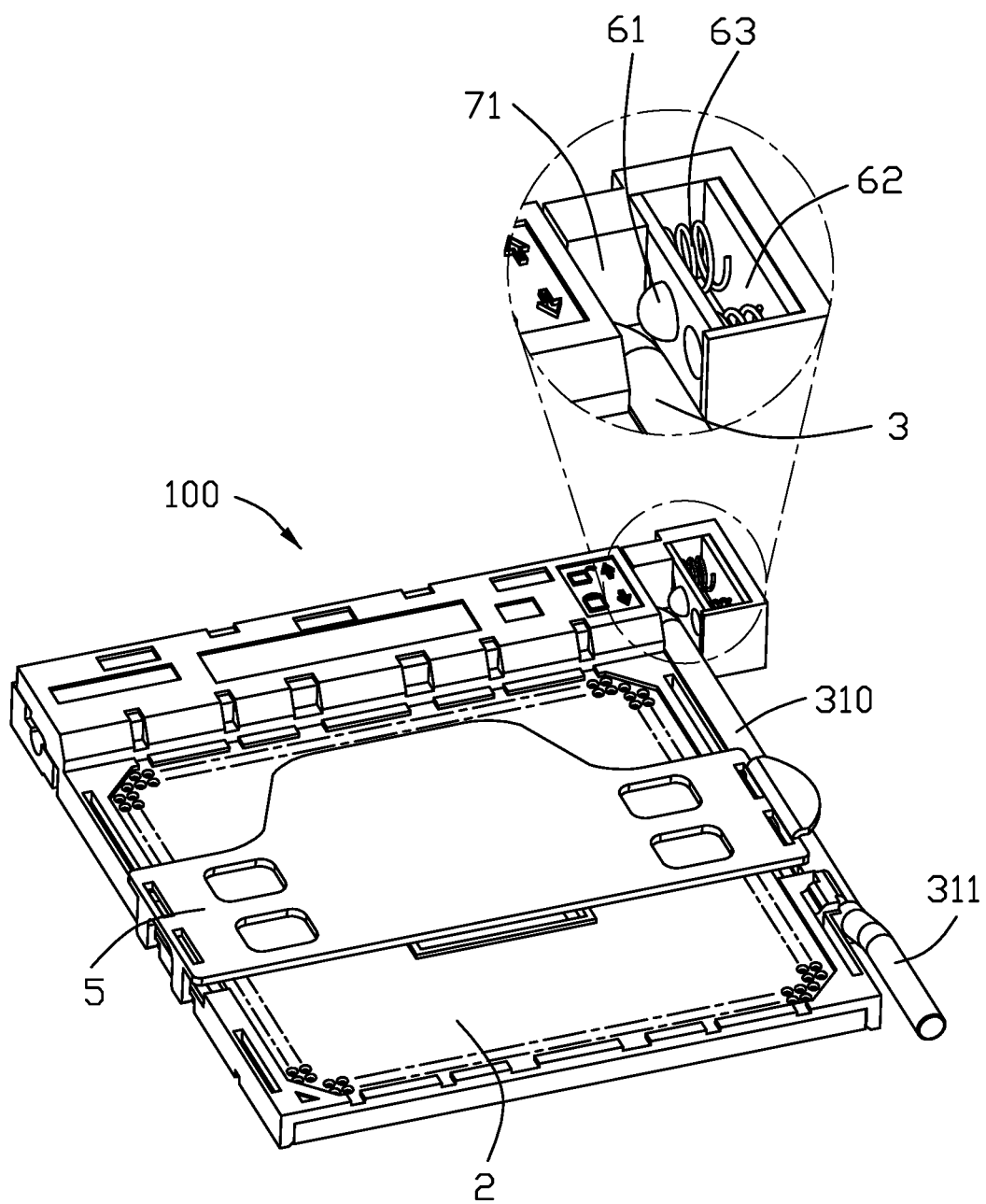
FIG. 9 is a front downward perspective view of an electrical connector according to a second embodiment of the invention wherein the lever is moved to the horizontal position.
Figure 10:
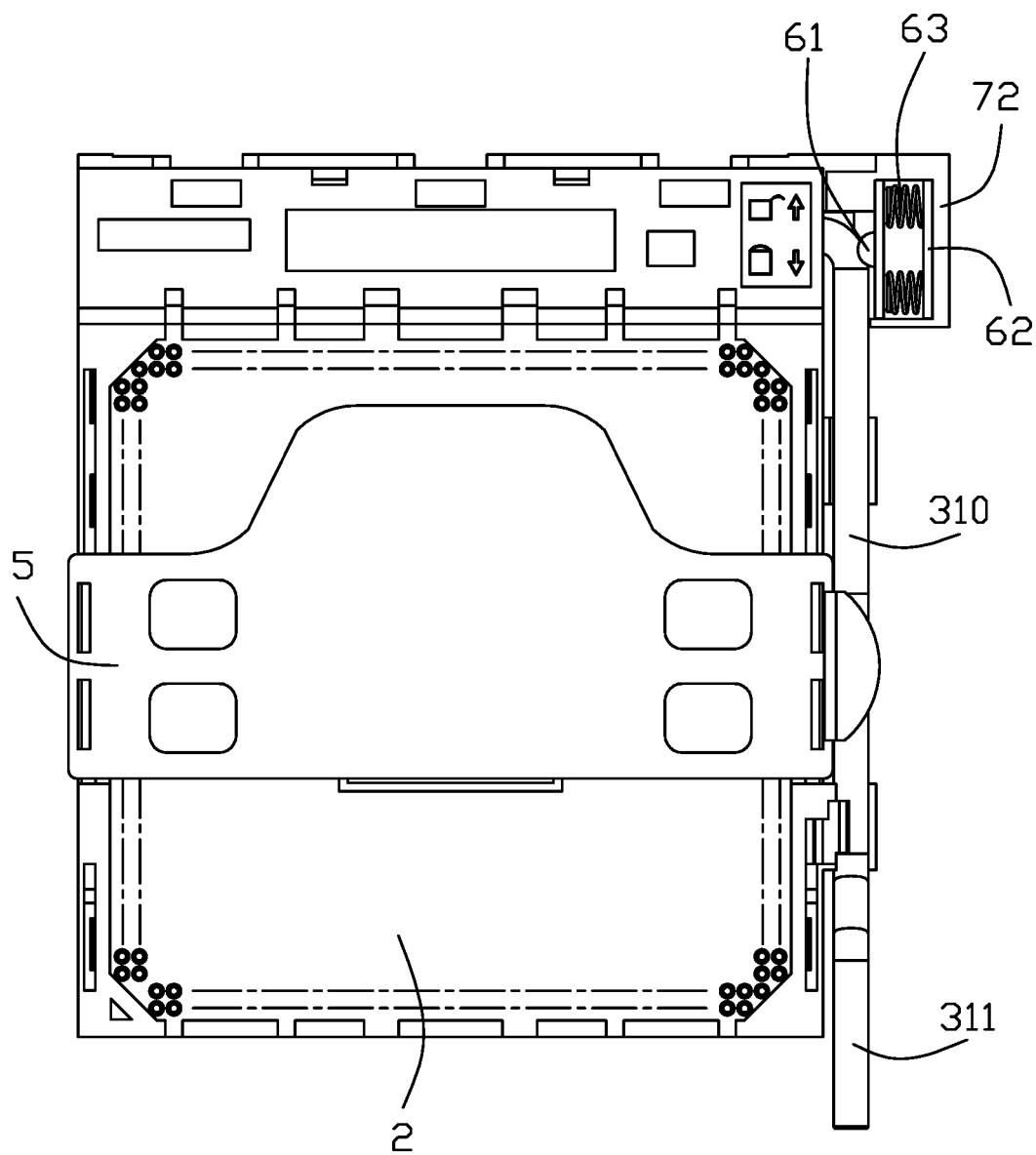
FIG. 10 is a top view of the electrical connector of FIG. 9.
Figure 11:
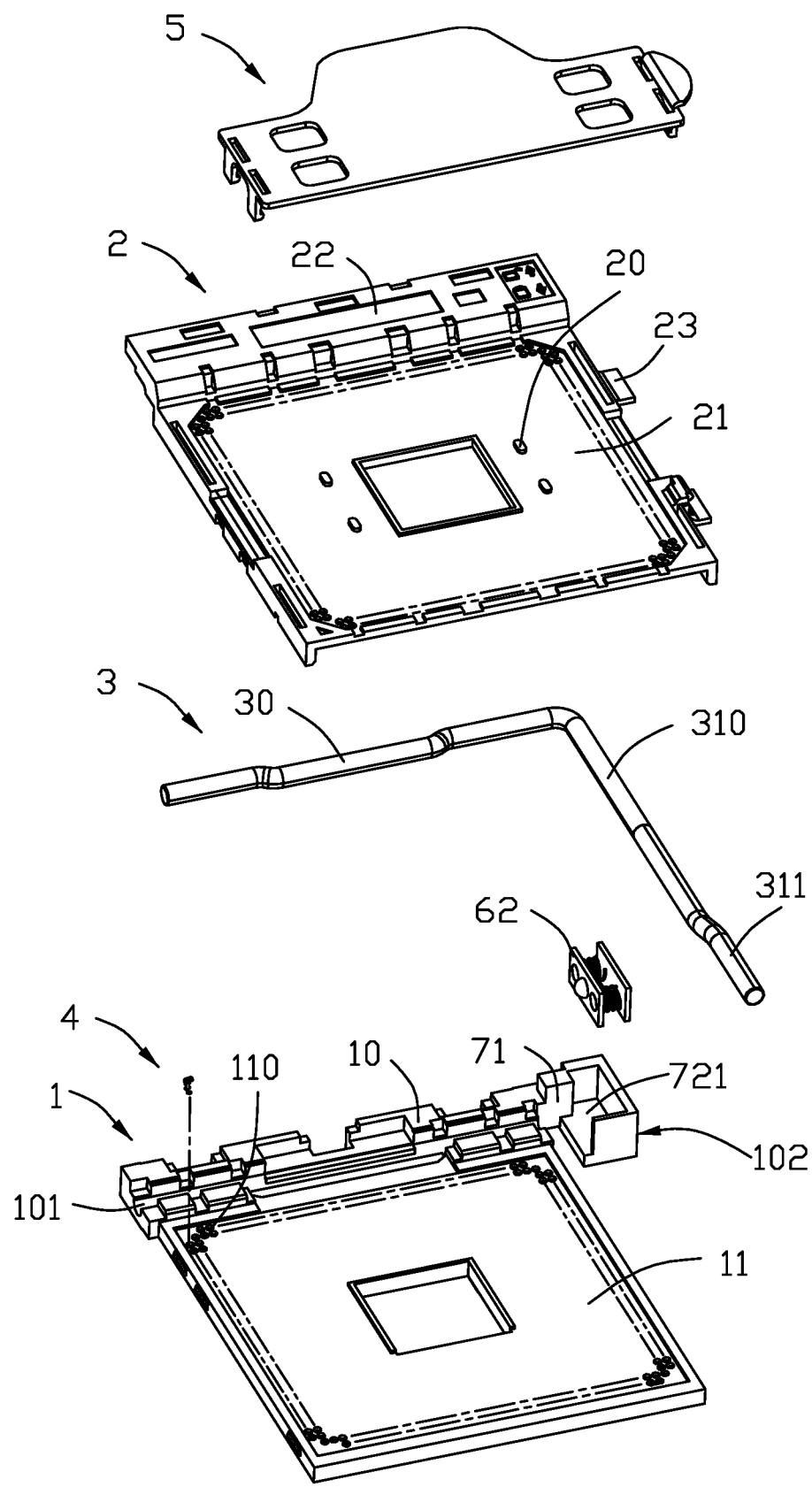
FIG. 11 is an exploded perspective of the electrical connector of FIG. 9.
Figure 12:
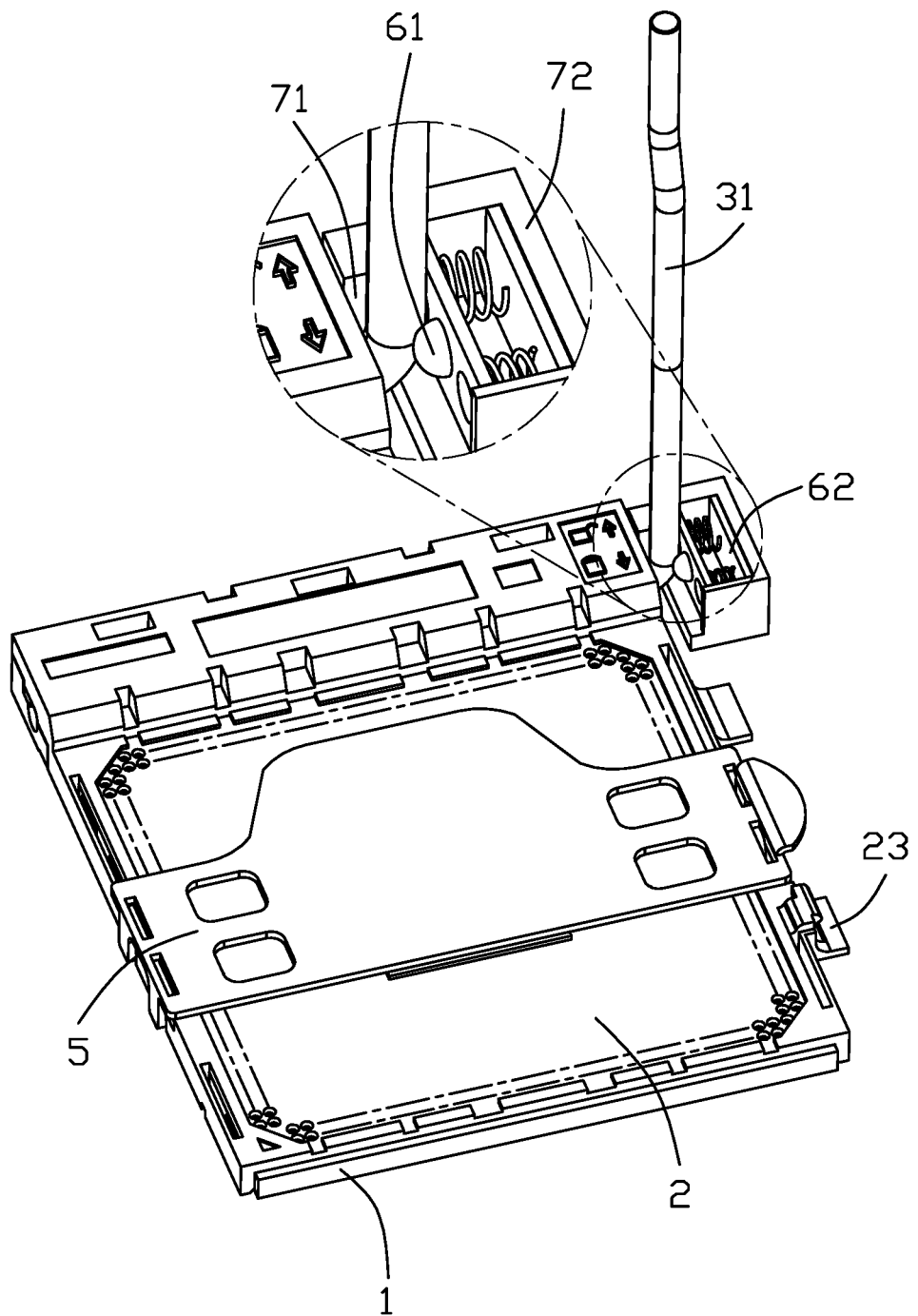
FIG. 12 is a front downward perspective view of the electrical connector of FIG. 9 wherein the lever is moved to an upstanding position.
Figure 13:
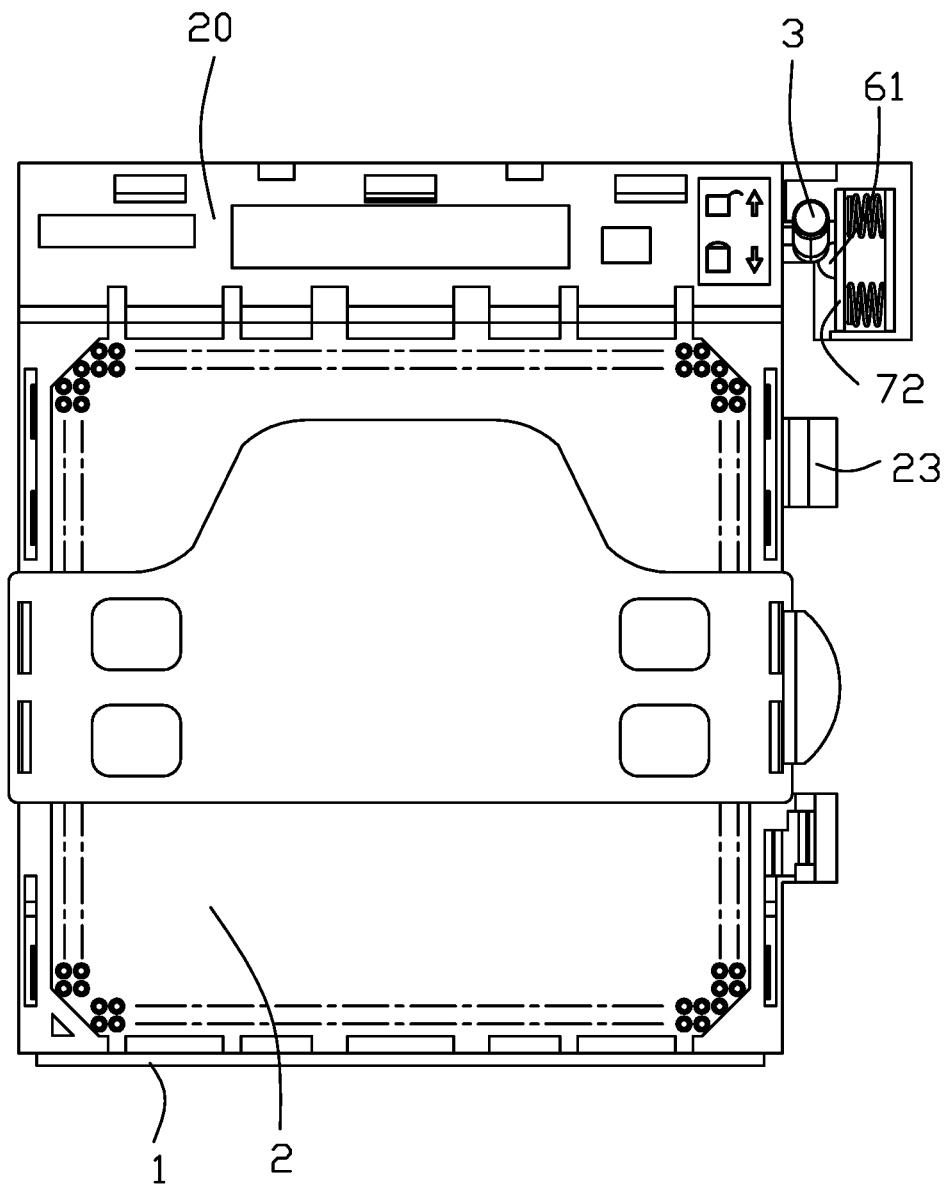
FIG. 13 is a top view of the electrical connector of FIG. 12.

Referring to FIGS. 9-13 showing the second embodiment, an electrical connector 100 for connecting the CPU and the printed circuit board, includes an insulative housing 1, a plurality of contacts disposed in the housing 1, an insulative cover 2 attached upon the housing 1 and actuated to moved by the metallic or plastic lever 3, and a pick-up cap 5 mounted upon the cover 5.

Similar to the first embodiment, the housing 1 includes a main body 11 having corresponding passageways 110 therein, and the lower head 10 having a groove 101 extending along the transverse direction and a restriction section 102 at one end of the groove 101 adjacent to the lever 3. The stopper 102 includes an abutment part 71 and a receiving part 72.

The cover 2 includes a carrying portion 21 aligned with the main body 11 in the vertical direction, and an upper head aligned with the lower head 10 in the vertical direction. The carrying portion 21 forms a plurality of through holes 22 aligned with the corresponding passageways 110, respectively.

The L-shaped lever 3 includes an actuation bar 30 received within the groove 101, and an operation bar 31 extending perpendicular to the actuation bar 30 and beside the housing 1. The operation bar 31 includes a connection section 310 and an operation section 311. The housing 1 further includes a pair of ears 23 to support the operation bar 31.

A resilient pressing part 6 is located at an outer side of the lever 3 around an joint between the actuation bar 30 and the operation bar 31. The resilient pressing part 6 includes a locking section 61 to engage the lever 3 for retaining the operation bar 31 of the lever 3 in the vertical direction. The resilient pressing part 6 includes in the receiving cavity 721 of the receiving part 72 a pair of plates 62 and a pair of springs 63 located therebetween in the transverse direction. Notably, the abutment part 71 restrains the inward movement of the inner plate 62, and the locking section 61 is semi-spherical for compliance with the operation bar 31 during retention and/or movement t of the locking section 61.

During operation, the operation bar 31 of the lever 3 can be rotated to and retained at the vertical position, via initially pushing the resilient pressing part 6 outwardly in the transverse direction and successively resuming the resilient pressing part 6 inwardly in the transverse direction due to the springs 63 wherein the operation bar 31 is located and retained between the abutment part 71 and the locking section 61 in the front-to-back direction. Understandably, the operation bar 31 can be rotated backward from the vertical position to the horizontal position via an inverse way of the resilient pressing part 6.

Figure 14:
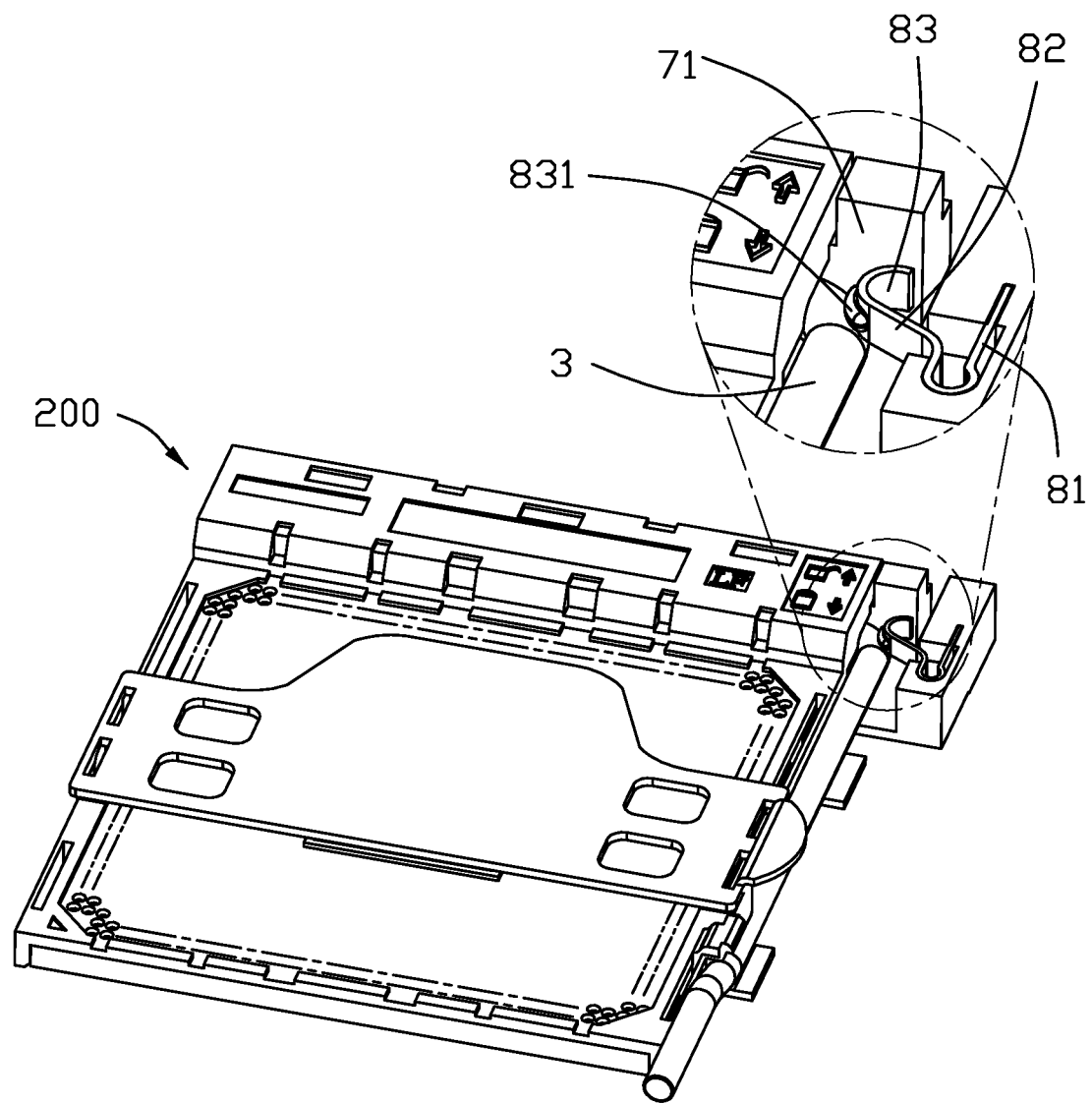
FIG. 14 is a front downward perspective view of an electrical connector according to a third embodiment of the invention wherein the lever is moved to the horizontal position.
Figure 15:
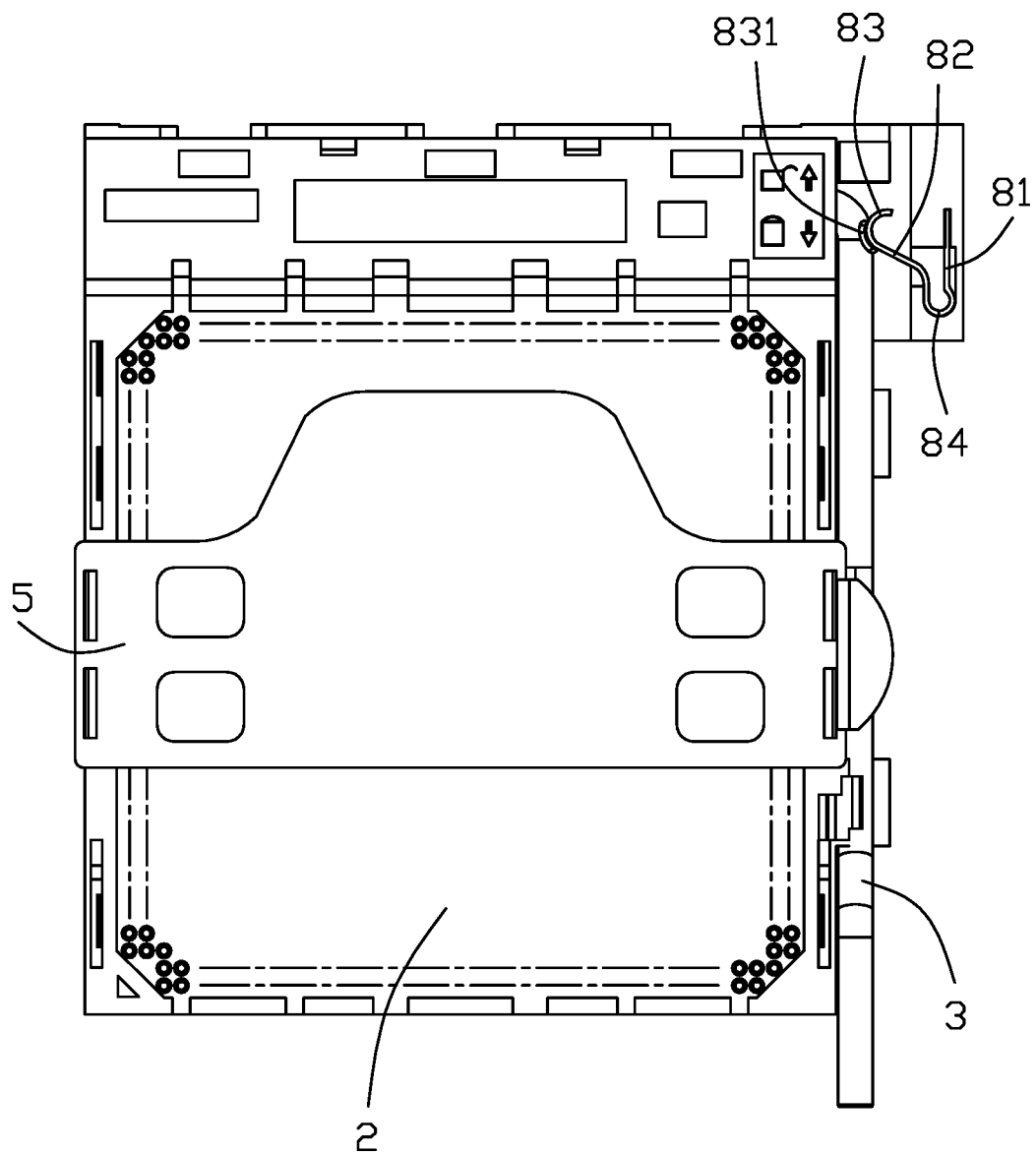
FIG. 15 is a top view of the electrical connector of FIG. 14.
Figure 16:
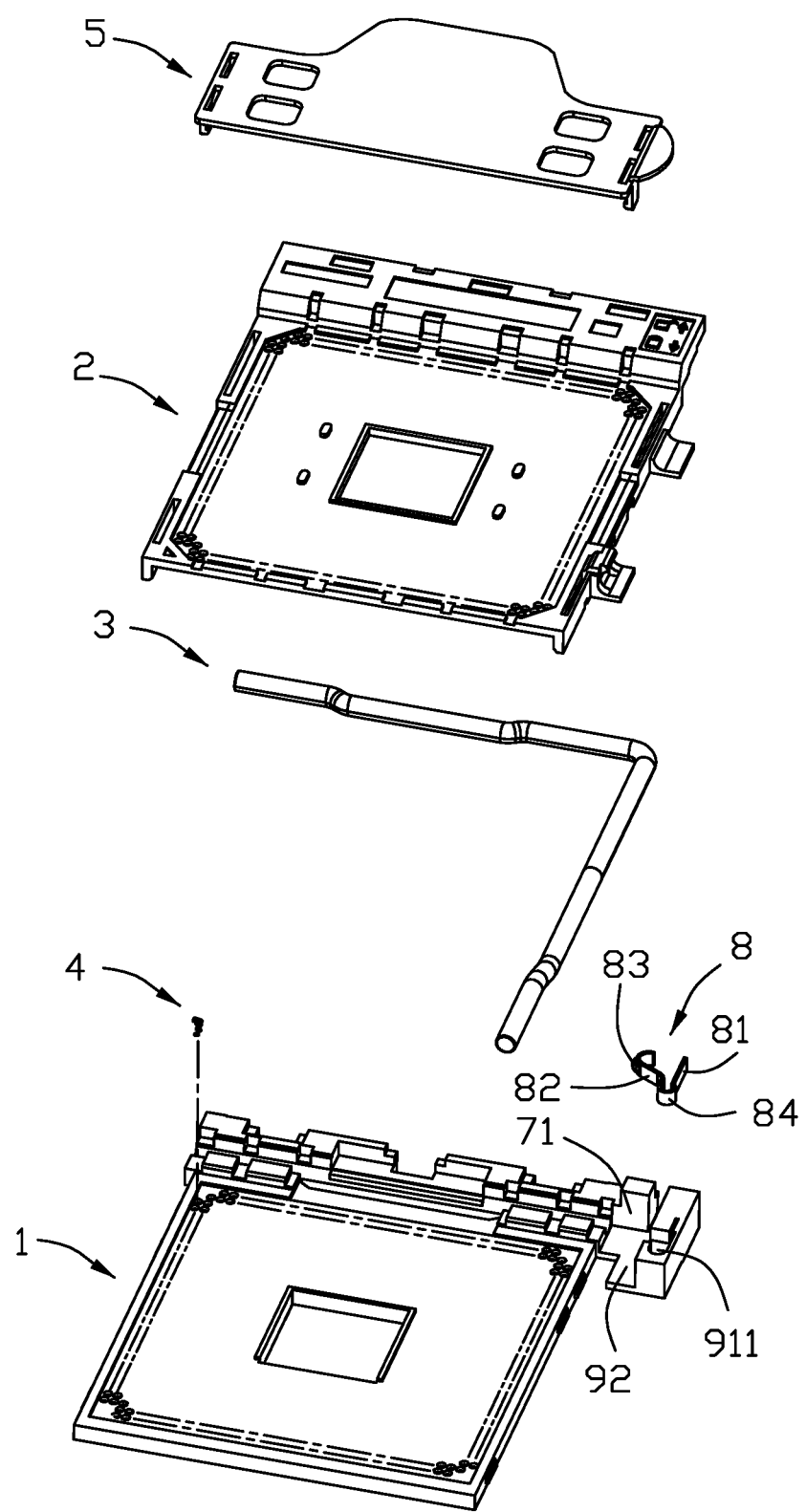
FIG. 16 is an exploded perspective of the electrical connector of FIG. 14.
Figure 17:
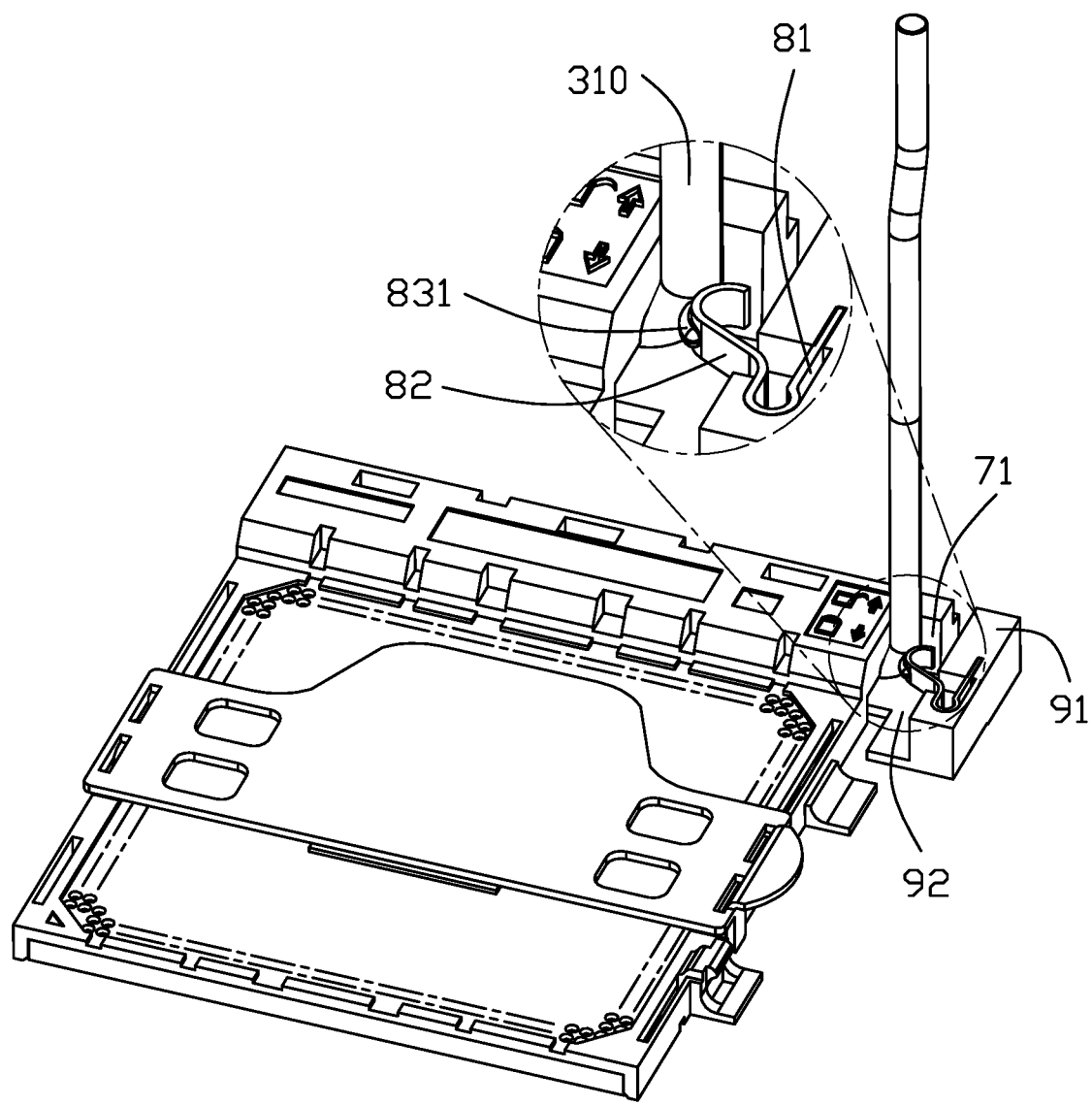
FIG. 17 is a front downward perspective view of the electrical connector of FIG. 14 wherein the lever is moved to an upstanding position
Figure 18:
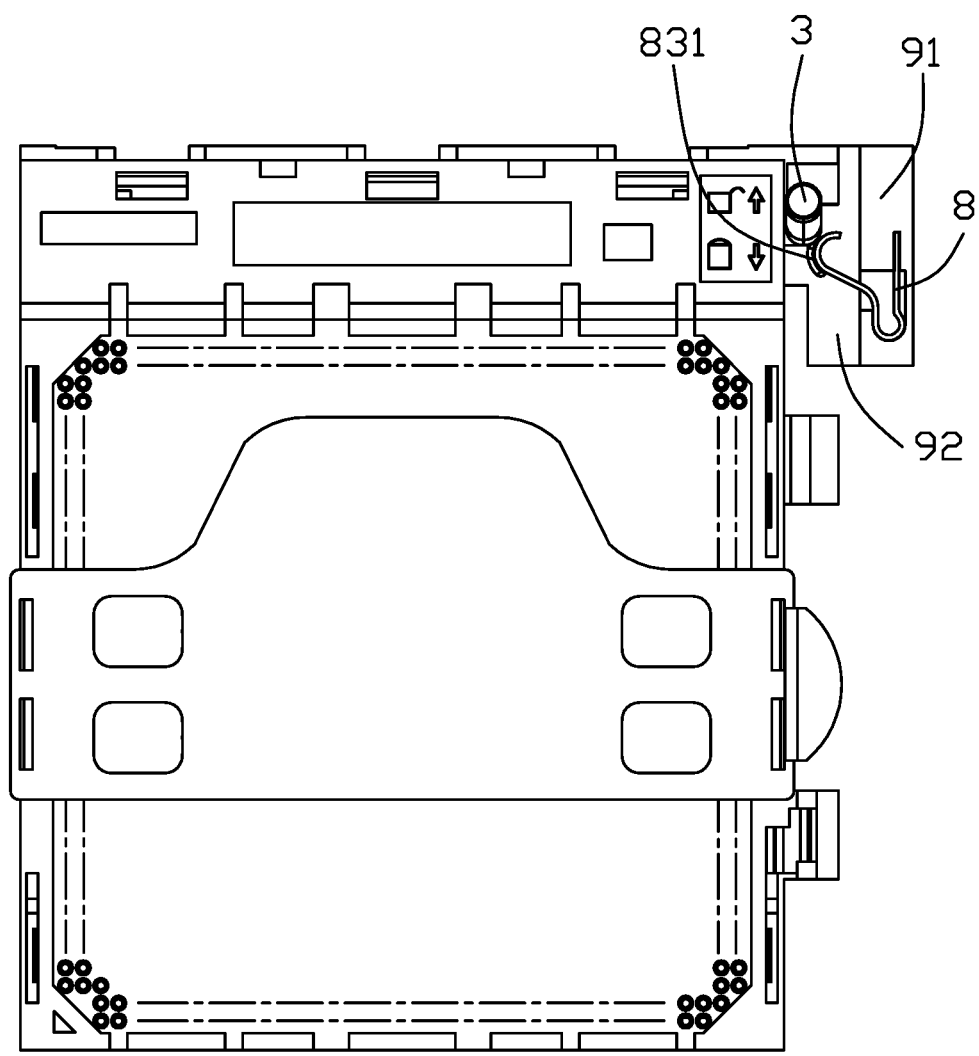
FIG. 18 is a top view of the electrical connector of FIG. 17.

Referring to FIGS. 14-18 showing the third embodiment, an electrical connector 200 for connecting the CPU and the printed circuit board, includes the related structures similar to those in the second embodiment except that the resilient pressing part 8 essentially formed by sheet metal, includes the plate 81 and a resilient extension 82 with a locking section 83 at the free end thereof and a curved section 84 linked between the plate 81 and the extension 82. The receiving part 9 includes a retention region 91 with a retention slot 911 therein, and the base 92 linked to the stopper 71. The plate 81 is retained in the retention region 91, and the extension 82 is supported upon the base 92, and the curved section 82 is received within the retention slot 911. The locking section 83 forms a protrusion 831 for compliance with retention and/or movement of the operation bar 31 of the lever 3. Notably, when the operation bar 31 is moved from the horizontal position to the vertical position, the operation bar 31 of the lever 3 is retained and located between the stopper 71 and the locking section 83 in the front-to-back direction. Notably, in both the second embodiment as shown in FIGS. 9-13 and the third embodiment as shown in FIGS. 14-18, the resilient pressing part impose the force to the operation bar 31 inwardly in the transverse direction instead of outwardly, thus avoiding potential jeopardized retention of the actuation bar 30 within the groove 101. In addition the locking section further imposes the force upon the operation bar when the operation bar is located in the horizontal position for avoiding misplacement of the operation bar.

Figure 19:
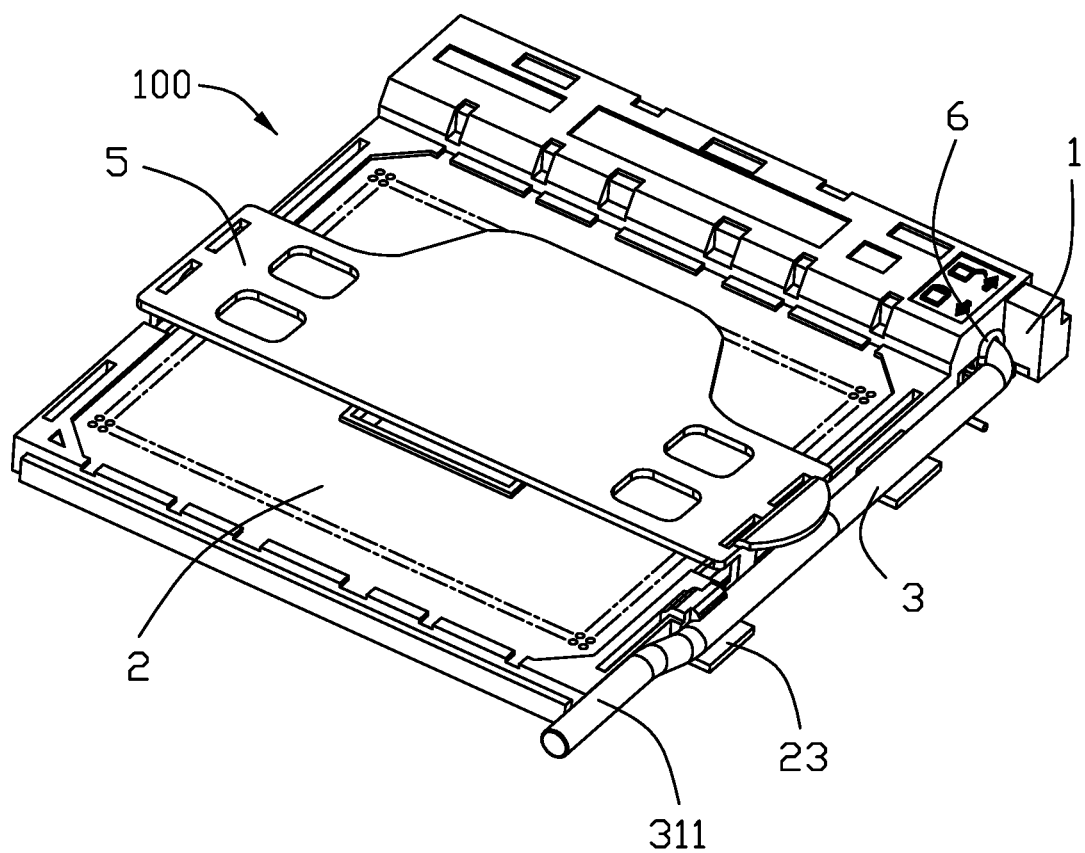
FIG. 19 is a front downward perspective view of an electrical connector according to a fourth embodiment of the invention wherein the lever is moved to the horizontal position.
Figure 20:
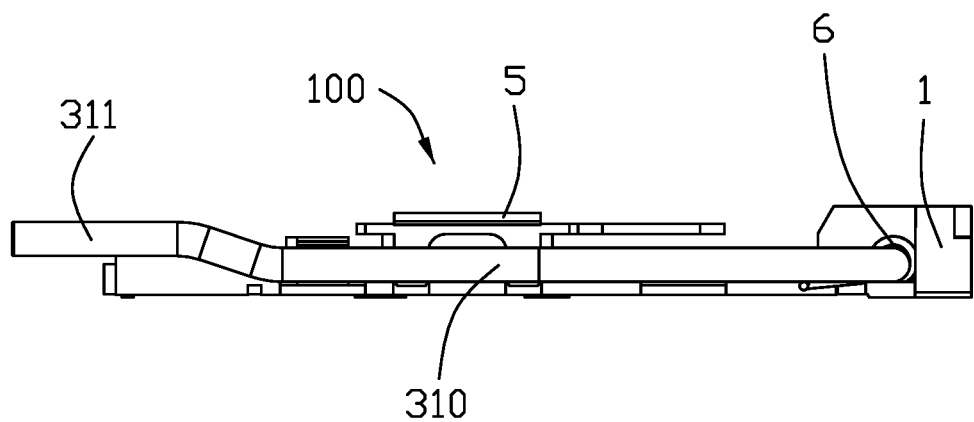
FIG. 20 is a side view of the electrical connector of FIG. 19.
Figure 21:
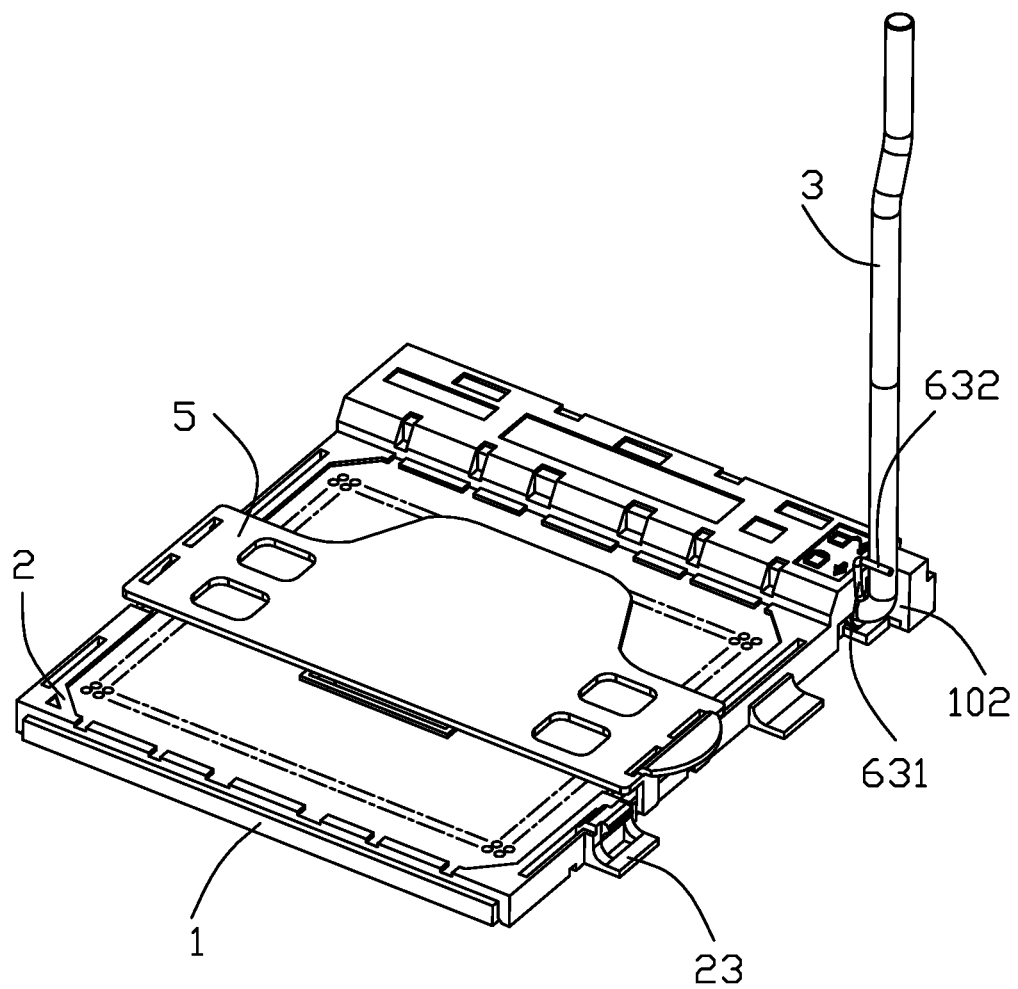
FIG. 21 is a front downward perspective view of the electrical connector of FIG. 19 wherein the lever is moved to the upstanding position.
Figure 22:
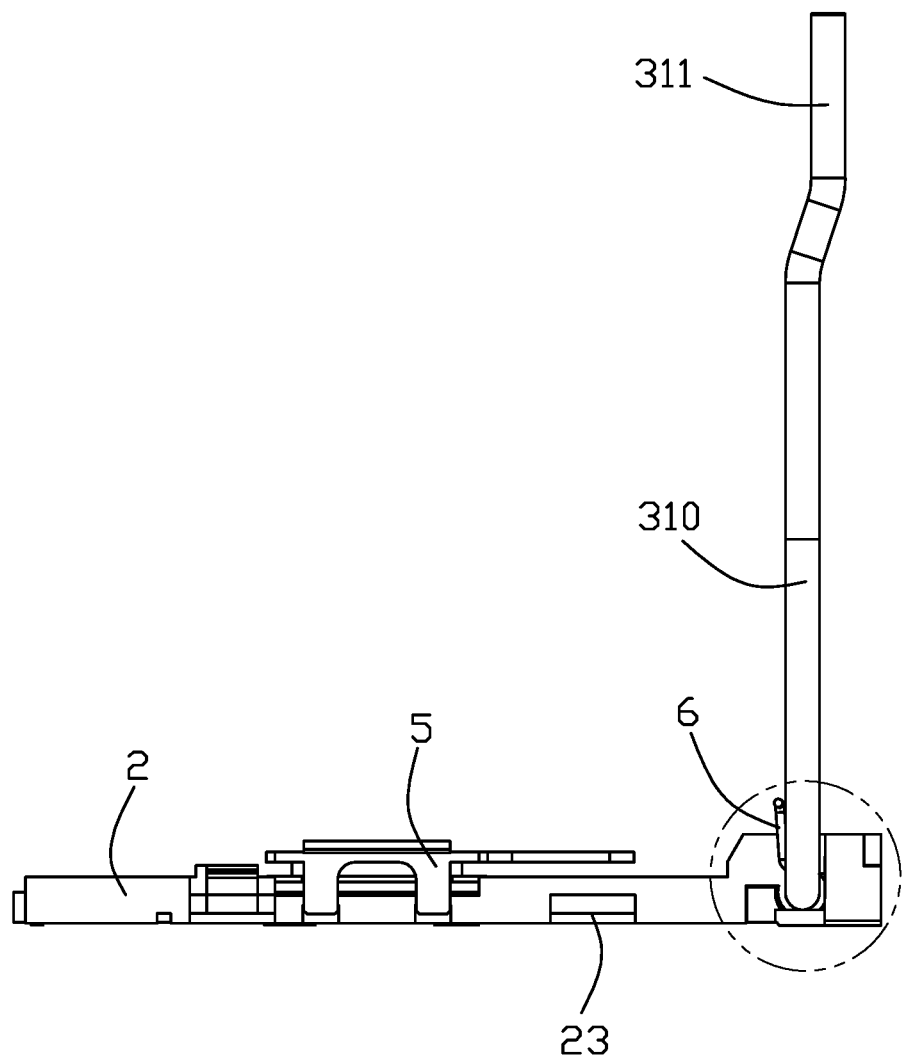
FIG. 22 is a side view of the electrical connector of FIG. 21.
Figure 23:
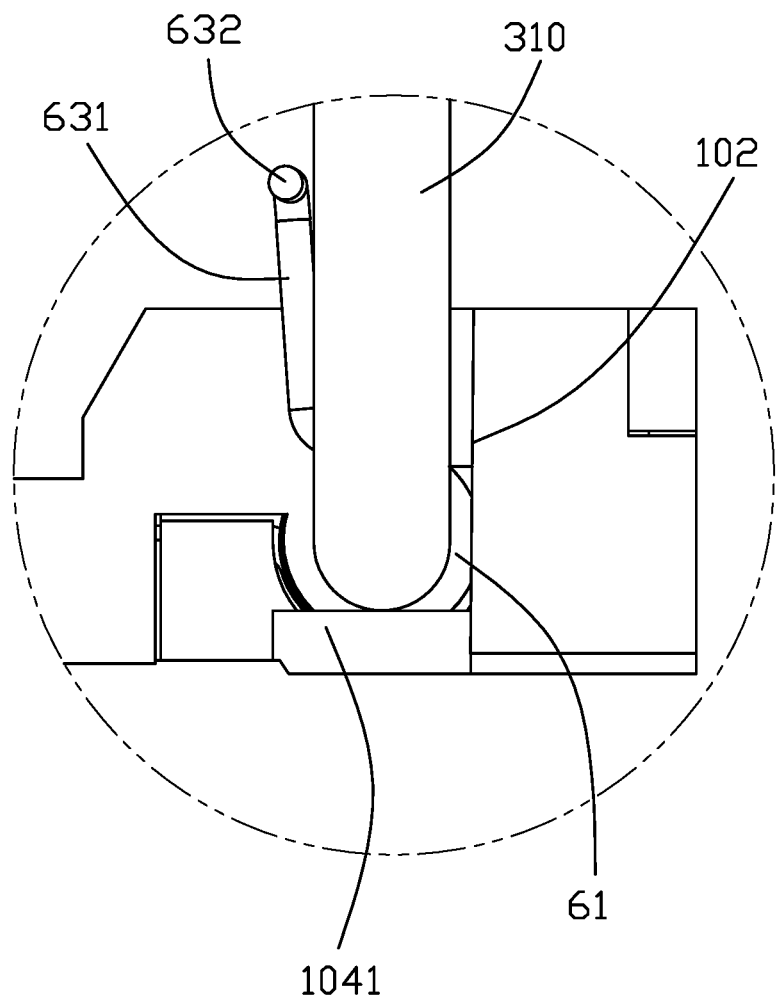
FIG. 23 is an enlarged side view of a portion of the electrical connector of FIG. 22.
Figure 24:
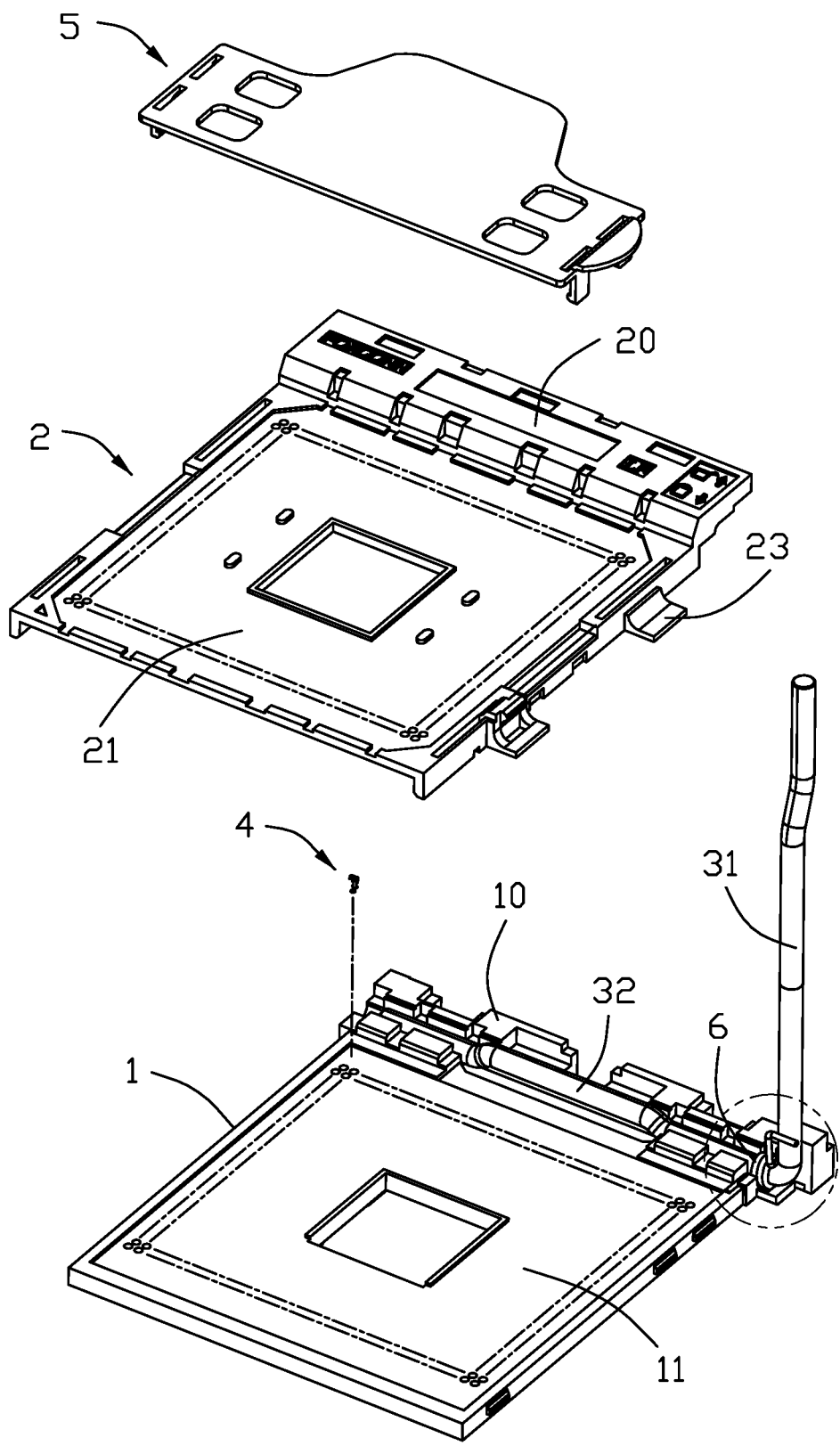
FIG. 24 is an exploded perspective view of the electrical connector of FIG. 22.
Figure 25:
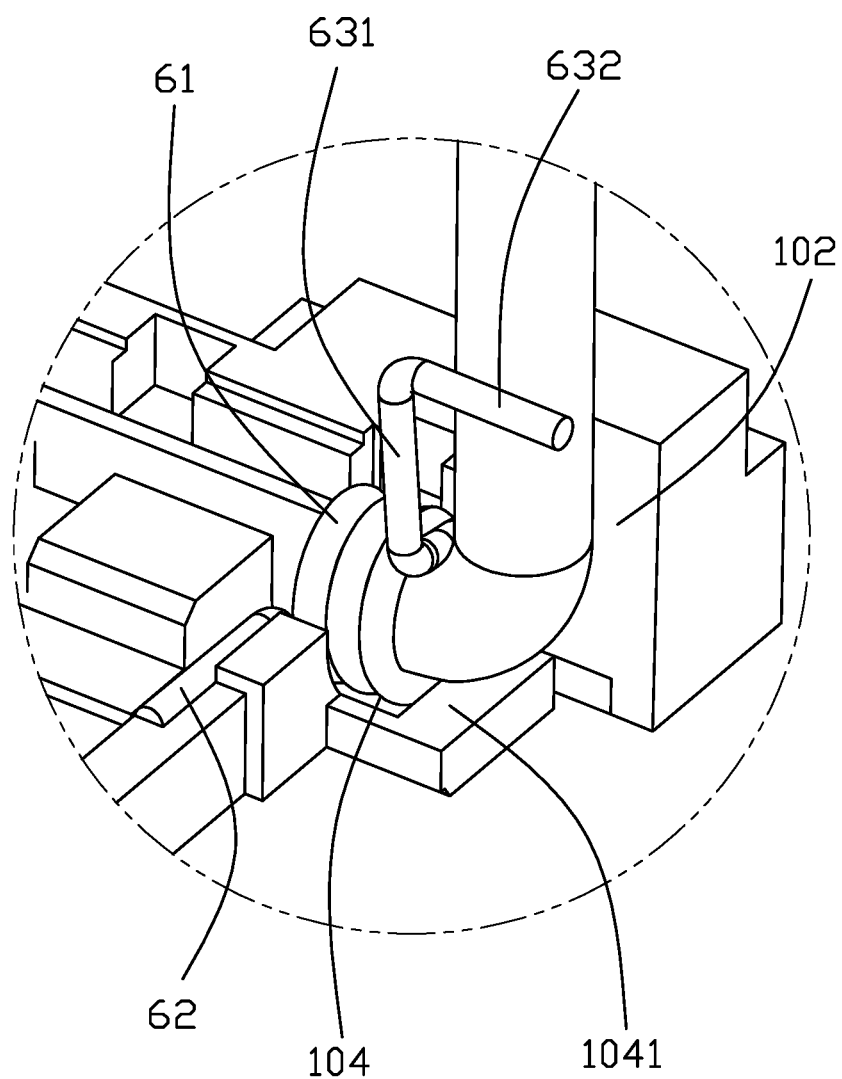
FIG. 25 is an enlarged perspective view of a portion of the electrical connector of FIG. 22.
Figure 26:
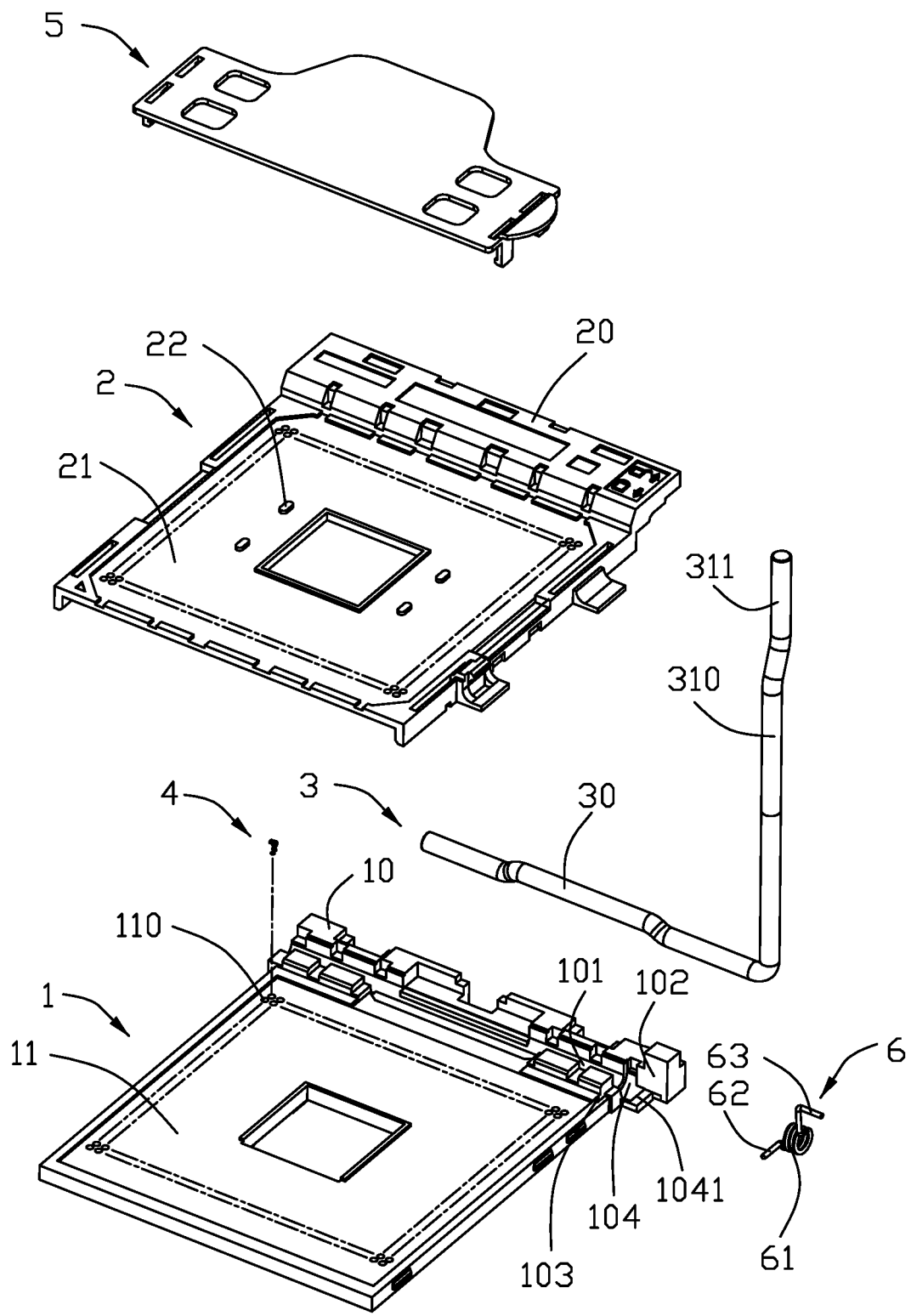
FIG. 26 is a further exploded perspective view of the electrical connector of FIG. 22.
Figure 27:
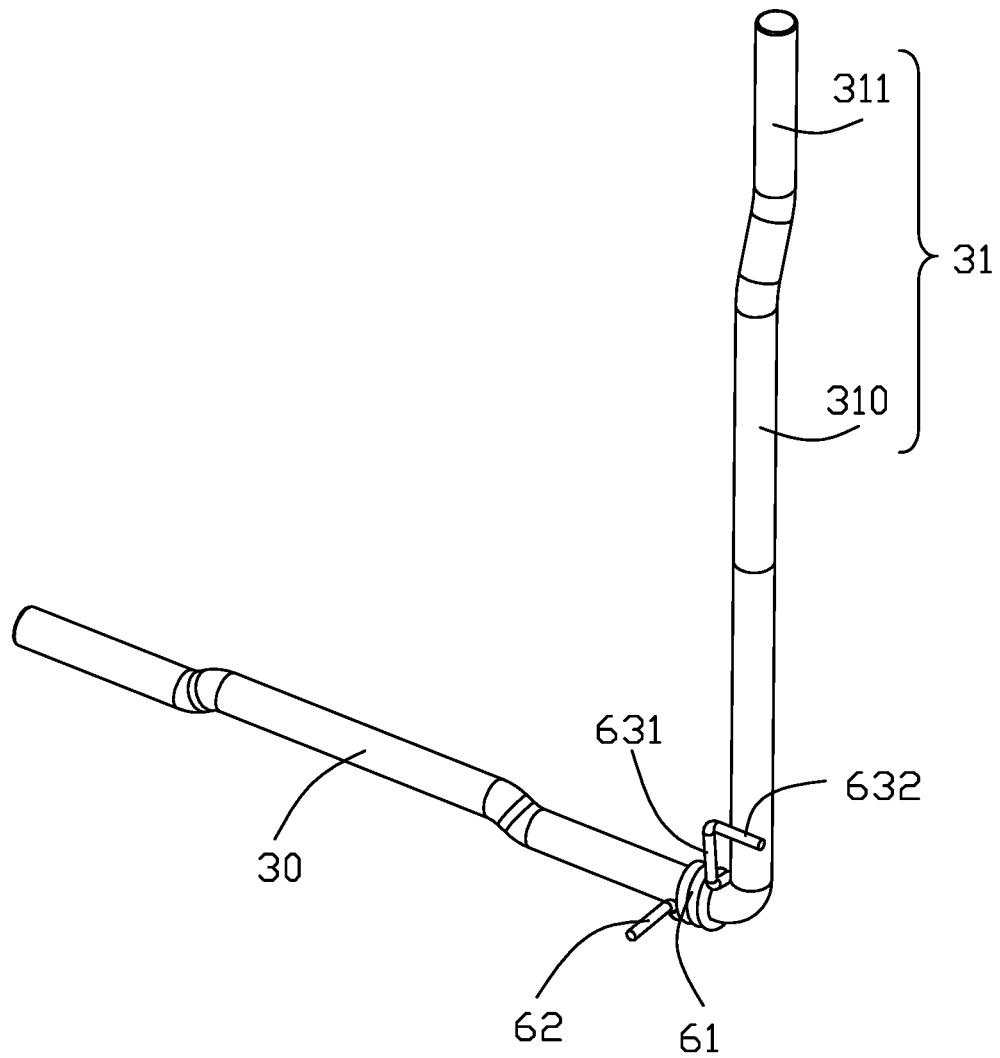
FIG. 27 is a perspective view of the lever of the electrical connector of FIG. 22.
Figure 28:
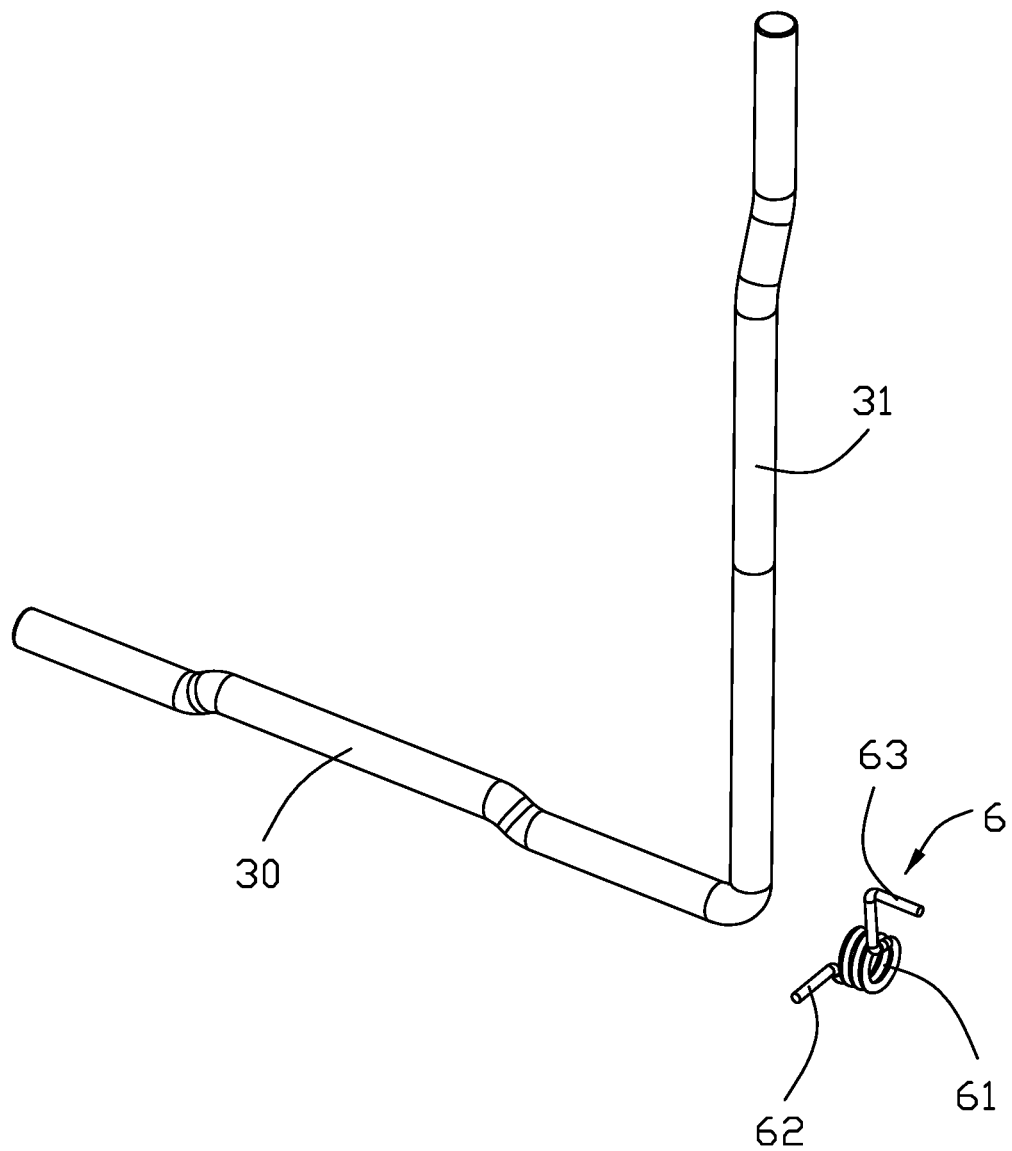
FIG. 28 is an exploded perspective view of the lever of the electrical connector of FIG. 22.

Referring to FIGS. 19-28 showing a fourth embodiment, an electrical connector 100 for connecting the CPU to the printed circuit board, includes an insulative housing 1, an insulative cover 2 urged by a metallic or plastic lever 3 to move relative to the housing 1 in a front-to-back direction, a plurality of contacts 4 disposed in the housing 1, and a pick-up cap 5 mounted upon the cover 2.

The housing 1 includes a main body 11 having a plurality of passageways 110 to receive the corresponding contacts 4, respectively, and a lower head 10 including a groove 101 and a slit 103 communicating with the groove 101. The low head 10 further includes a stopper 102 in front of the lever 3.

The cover 2 includes a carrying portion 21 aligned with the main body 11, and an upper head 20 aligned with the lower head 10 in the vertical direction. The carrying portion 21 forms a through holes 22 aligned with the corresponding passageways 110 in the vertical direction.

The L-shaped lever 3 includes an actuation bar 30 in the groove 101 and between the upper head 20 and the lower head 10 in the vertical direction, and an operation bar 31 extending perpendicular to the actuation bar 30 outside of the housing 1 and including a connection section 310 linked to the actuation bar 30 and an operation section 311 at a free end thereof. The housing 1 includes a pair of ears 23 for supporting the operation bar 31 when the operation bar 31 is moved to the horizontal position.

The lever 3 is equipped with a resilient pressing part 6 adjacent to an joint between the operation bar 31 and the actuation bar 30. The resilient pressing part 6 includes a surrounding section 61, a fixing section 62 and a pushing/locking section 63 at two opposite ends thereof. In this embodiment, the pushing/locking section 63 urges the lever 3 against the stopper 102. The lower head 10 includes a receiving part 104 beside the groove 101 with a supporting platform 1041 thereunder to receive the surrounding part 61. The fixing section 62 is retained in the slit 103. The surrounding section 61 surrounds the actuation bar 30 around the actuation bar 30 around the aforementioned joint. The pushing/locking section 63 includes a first segment 631 extending from the surrounding section 61 perpendicular to the axis of the actuation bar 30, and a second segment 632 extending from the first segment 632 parallel to the axis of the actuation bar 30 and constantly abutting against the operation bar 31.

Understandably, the resilient pressing part 6 is a torsion spring to have the first second segment 632 of the pushing/locking section 63 constantly urge the operation bar 31 toward the vertical position against the stopper 102, thus assuring reliable position when the operation bar 31 is moved to the vertical position. Notably, the torsion spring may be replace with the compressible spring finger as long as an upward force is provided thereof constantly. Clearly, in this embodiment no outward force is applied to the lever 3 in the transverse direction, so no potential jeopardized retention of the actuation bar in the groove may occur.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical connector comprising:
   an insulative housing including a main body with a plurality of passageways therein, and a lower head in front of the main body in a front-to-back direction;
   an insulative cover attached upon the housing in a vertical direction perpendicular to said front-to-back direction, and including a carrying portion aligned with the main body in the vertical direction, and an upper head aligned with the lower head in the vertical direction, a plurality of through holes formed in the carrying portion in alignment with the corresponding passageways, respectively, in the vertical direction;
   a plurality of contacts disposed in the corresponding passageways, respectively, and
   an L-shaped lever including an actuation bar extending along a transverse direction perpendicular to both the front-to-back direction and the vertical direction, and sandwiched between the upper head and the lower head in the vertical direction to urge the cover to move back and forth relative to the housing in said front-to-back direction, and an operation bar exposed on a lateral side of the housing and rotatable between a horizontal position along the front-to-back direction and a vertical position along the vertical direction; wherein
   either the housing or the lever is further equipped with a locking section protruding either in the front-to-back direction or inwardly in said transverse direction so as to temporarily hold the operation bar of the lever in the vertical position securely.

2. The electrical connector as claimed in claim 1, wherein said housing forms a stopper in front of the operation bar in the front-to-back direction, and the locking section is formed on the stopper to downwardly abut against an engagement section of an interference part applied upon the operation bar around a joint between the operation bar and the actuation bar.

3. The electrical connector as claimed in claim 1, wherein the locking section is formed on a resilient pressing part outwardly located beside the operation bar along the transverse direction, and said resilient pressing part includes a spring constantly urging the locking section toward the operation bar inwardly in the transverse direction.

4. The electrical connector as claimed in claim 3, wherein the housing forms a stopper in front of the operation bar in the front-to-back direction, and the operation bar is held between the stopper and the locking section in the front-to-back direction.

5. The electrical connector as claimed in claim 4, wherein said locking section has a semi-spherical configuration.

6. The electrical connector as claimed in claim 3, wherein said resilient pressing part is a unitary piece formed by sheet metal.

7. The electrical connector as claimed in claim 6, wherein the resilient pressing part includes a plate secured to the housing, an extension and a curved section both located between the plate and the locking section to provide resiliency therewith.

8. The electrical connector as claimed in claim 3, wherein said spring is discrete from the locking section which is located upon a plate which the spring abuts against inwardly in the transverse direction.

9. The electrical connector as claimed in claim 1, wherein the locking section is formed on a resilient device to constantly urge the operation bar toward the vertical position.

10. The electrical connector as claimed in claim 9, wherein said resilient device is a torsion spring having a surrounding section enclosing the actuation bar around a joint between the actuation bar and the operation bar, and said locking section is located at one end of said torsion spring.

11. The electrical connector as claimed in claim 10, wherein said torsion further includes a fixing section located at the other end of the torsion spring and retained in a slit in the housing.

12. The electrical connector as claimed in claim 10, wherein said locking section includes a first segment linked to the surrounding section perpendicular to an axis of the actuation bar, and a second segment extending from the first segment parallel to the axis of the actuation bar to constantly urge the operation bar toward the vertical position.

13. An electrical connector comprising:
an insulative housing including a main body with a plurality of passageways therein, and a lower head in front of the main body in a front-to-back direction;
an insulative cover attached upon the housing in a vertical direction perpendicular to said front-to-back direction, and including a carrying portion aligned with the main body in the vertical direction, and an upper head aligned with the lower head in the vertical direction, a plurality of through holes formed in the carrying portion in alignment with the corresponding passageways, respectively, in the vertical direction;
a plurality of contacts disposed in the corresponding passageways, respectively, and an L-shaped lever including an actuation bar extending along a transverse direction perpendicular to both the front-to-back direction and the vertical direction, and sandwiched between the upper head and the lower head in the vertical direction to urge the cover to move back and forth relative to the housing in said front-to-back direction, and an operation bar exposed on a lateral side of the housing and rotatable between a horizontal position along the front-to-back direction and a vertical position along the vertical direction; wherein
the housing is further equipped with a locking section actuated either in the front-to-back direction or inwardly in said transverse direction so as to temporarily hold the operation bar of the lever in the vertical position securely.

14. The electrical connector as claimed in claim 13, wherein the locking section is formed on a resilient pressing part outwardly located beside the operation bar along the transverse direction, and said resilient pressing part includes a spring constantly urging the locking section toward the operation bar inwardly in the transverse direction.

15. The electrical connector as claimed in claim 14, wherein the housing forms a stopper in front of the operation bar in the front-to-back direction, and the operation bar is held between the stopper and the locking section in the front-to-back direction.

16. The electrical connector as claimed in claim 13, wherein said spring is discrete from the locking section which is located upon a plate which the spring abuts against inwardly in the transverse direction.

17. The electrical connector as claimed in claim 13, wherein the locking section is formed on a resilient device to constantly urge the operation bar toward the vertical position.

18. The electrical connector as claimed in claim 17, wherein said resilient device is a torsion spring having a surrounding section enclosing the actuation bar around a joint between the actuation bar and the operation bar, and said locking section is located at one end of said torsion spring.

19. The electrical connector as claimed in claim 18, wherein said torsion further includes a fixing section located at the other end of the torsion spring and retained in a slit in the housing.

20. The electrical connector as claimed in claim 18, wherein said locking section includes a first segment linked to the surrounding section perpendicular to an axis of the actuation bar, and a second segment extending from the first segment parallel to the axis of the actuation bar to constantly urge the operation bar toward the vertical position.

* * * * *